(12) United States Patent
Liu et al.

(10) Patent No.: US 10,199,105 B2
(45) Date of Patent: Feb. 5, 2019

(54) NON-VOLATILE RESISTIVE MEMORY CONFIGURATION CELL FOR FIELD PROGRAMMABLE GATE ARRAY

(71) Applicant: Crossbar, Inc., Santa Clara, CA (US)

(72) Inventors: Lin Shih Liu, Fremont, CA (US); Hagop Nazarian, San Jose, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 15/592,999

(22) Filed: May 11, 2017

(65) Prior Publication Data

US 2017/0330622 A1     Nov. 16, 2017

Related U.S. Application Data

(60) Provisional application No. 62/335,404, filed on May 12, 2016.

(51) Int. Cl.
| | |
|---|---|
| G11C 5/06 | (2006.01) |
| G11C 14/00 | (2006.01) |
| G11C 11/419 | (2006.01) |
| G11C 13/00 | (2006.01) |
| G11C 11/412 | (2006.01) |

(52) U.S. Cl.
CPC .......... *G11C 14/009* (2013.01); *G11C 11/419* (2013.01); *G11C 13/004* (2013.01); *G11C 13/0026* (2013.01); *G11C 13/0069* (2013.01); *G11C 13/0097* (2013.01); *G11C 11/412* (2013.01)

(58) Field of Classification Search
CPC .............. G11C 14/009; G11C 13/0097; G11C 13/0069; G11C 13/004; G11C 11/419; G11C 13/0026; G11C 11/412
USPC .......................................................... 365/72
See application file for complete search history.

(56) References Cited

U.S. PATENT DOCUMENTS

| | | | | |
|---|---|---|---|---|
| 5,214,327 A | * | 5/1993 | Saeki ..................... | H03K 3/037 326/38 |
| 5,581,198 A | * | 12/1996 | Trimberger ........... | G11C 11/406 326/38 |

(Continued)

OTHER PUBLICATIONS

Taiwanese Office Action and Search Report for Taiwanese Patent Application No. 106115764 dated Mar. 23, 2018, 16 pages (including English translation).

*Primary Examiner* — Tha-O H Bui
(74) *Attorney, Agent, or Firm* — Amin, Turocy & Watson, LLP

(57) ABSTRACT

Providing for a configuration cells for junction nodes of a field programmable gate array (FPGA) is described herein. By way of example, a configuration cell can comprise non-volatile resistive switching memory to facilitate programmable storage of data as an input to a control circuit of a junction node. The control circuit can activate or deactivate a junction node of the FPGA in response to a value of the data stored in the non-volatile resistive switching memory. The control circuit can comprise an SRAM circuit for fast operation of the junction node. Moreover, the non-volatile memory of the configuration cell facilitates fast power-up of the control circuit utilizing data stored in the resistive switching memory, and minimizes power consumption associated with storing the data.

20 Claims, 26 Drawing Sheets

(56) References Cited

U.S. PATENT DOCUMENTS

| | | | |
|---|---|---|---|
| 5,760,602 A * | 6/1998 | Tan | G11C 11/419 |
| | | | 326/38 |
| 6,222,757 B1 | 4/2001 | Rau et al. | |
| 7,092,293 B1 | 8/2006 | Young et al. | |
| 7,193,885 B2 * | 3/2007 | McCollum | G11C 5/005 |
| | | | 365/154 |
| 9,042,157 B2 | 5/2015 | Guillemenet et al. | |
| 9,117,521 B2 | 8/2015 | Guillemenet et al. | |
| 9,666,276 B2 | 5/2017 | Baker, Jr. | |
| 9,729,155 B2 | 8/2017 | Nazarian et al. | |
| 2005/0062497 A1 | 3/2005 | Pellizzer et al. | |
| 2005/0073876 A1 | 4/2005 | Chen et al. | |
| 2011/0280073 A1 | 11/2011 | Chiu et al. | |
| 2014/0050025 A1 | 2/2014 | Tsao et al. | |

* cited by examiner

NON-VOLATILE RESISTIVE MEMORY CONFIGURATION CELL FOR FIELD PROGRAMMABLE GATE ARRAY

CROSS-REFERENCE TO RELATED APPLICATIONS

The present application for patent claims the benefit of U.S. Provisional Patent Application No. 62/335,404 entitled NON-VOLATILE RESISTIVE MEMORY CONFIGURATION CELL FOR FIELD PROGRAMMABLE GATE ARRAY and filed May 12, 2016, which is hereby incorporated by reference herein in its entirety and for all purposes.

INCORPORATION BY REFERENCE

The following U.S. patents and U.S. patent applications are hereby incorporated by reference herein in their respective entireties and for all purposes: U.S. Pat. No. 8,754,671 issued from U.S. application Ser. No. 13/194,479 filed Jul. 29, 2011, U.S. Pat. No. 8,674,724 issued from U.S. application Ser. No. 13/194,500 filed Jul. 29, 2011, U.S. Pat. No. 9,054,702B2 issued from U.S. patent application Ser. No. 14/304,572 filed Jun. 13, 2014, U.S. Pat. No. 9,191,000 issued from U.S. application Ser. No. 14/166,700 filed Feb. 28, 2014, U.S. Pat. No. 8,198,144 issued from U.S. patent application Ser. No. 13/158,231 filed Jun. 10, 2011 and U.S. patent application Ser. No. 14/335,507 filed Jul. 18, 2014.

TECHNICAL FIELD

The subject disclosure relates generally to resistive switching memory technology, and as one illustrative example, a configuration cell(s) comprising non-volatile resistive switching memory for a field programmable gate array.

BACKGROUND

The inventor(s) of the present disclosure have proposed models of two-terminal memory devices expected to operate as viable alternatives to various memory cell technologies, such as metal-oxide semiconductor (MOS) type memory cells employed for electronic storage of digital information. Models of memory cells using two-terminal memory such as resistive-switching memory devices among others, are believed by the inventor(s) to provide some potential advantages over purely non-volatile FLASH MOS type transistors, including smaller die size, higher memory density, faster switching (e.g., from a relatively conductive state to a relatively non-conductive state, or vice versa), good data reliability, low manufacturing cost, fab-compatible processes, and other advantages, for example.

One two-terminal memory expected to have promising physical characteristics is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others. In light of the above, the inventors endeavor to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments of the present disclosure provide configuration cells for junction nodes of a field programmable gate array (FPGA). Discloses configuration cells can comprise non-volatile resistive switching memory, in one or more embodiments. The non-volatile resistive switching memory can facilitate storage of a data value to be set to an associated junction node. By storing the data value in non-volatile memory, the data value can be preserved without continuous power applied to the configuration cell, in at least some embodiments, and further can store the data value in the absence of external power. Moreover, by utilizing two-terminal resistive switching memory for the non-volatile memory, at least a subset of the configuration cell can be constructed in a backend-of-line process and at higher memory densities than conventional non-volatile memory.

In further embodiments, a disclosed configuration cell can comprise an SRAM structure configured to apply charge to an FPGA switch of a junction node. The SRAM structure can be set according to the data value stored by the non-volatile memory cell, and can be reset by activation of a reset signal, as one example.

In still other embodiments, a disclosed configuration cell can comprise multiple resistive switching memory cells at a junction node. Respective memory cells can store respective data values to be programmed to an FPGA switch at the junction node. The multiple memory cells can facilitate programming a sequence of data values to the junction node, facilitating storage of multiple data matrices that can be programmed to junction nodes of the FPGA. Such embodiments facilitate non-volatile storage of the multiple data matrices, as well programming of subsets of the memory cells concurrent with operations of the FPGA. Accordingly, a new data map can be loaded into a set of memory devices while operations are conducted on the FPGA that is configured according to a second data map.

In an additional embodiment, the subject disclosure provides a program and control circuit for a FPGA. The program and control circuit can comprise an SRAM circuit having an SRAM input and an SRAM output, wherein the SRAM output is connected to a switch that controls a junction of the FPGA and a memory circuit comprising a non-volatile resistive memory, and having a memory output connected to the SRAM input and having a memory input.

Further, the program and control circuit can comprise a sourceline connected to the memory input and a readset line configured to selectively activate the SRAM input causing the SRAM circuit to receive a data value stored at the non-volatile resistive memory from the memory output. In one or more alternative or additional embodiments, the memory circuit further comprises a bypass transistor connected in parallel to the non-volatile resistive memory, wherein a first contact of the bypass transistor and a first terminal of the non-volatile resistive memory are connected to the memory output, and wherein a second contact of the bypass transistor and a second terminal of the non-volatile resistive memory are connected to the memory input.

In additional embodiments, the subject disclosure provides a configuration bit for a switching block junction of an electronic device. The configuration bit can comprise a switch that controls electrical connection of the switching block junction, the switch having a control input and a control circuit that generates a signal output that drives the control input of the switch, the switch being responsive to the signal output and configured to electrically connect the switching block junction in response to a first signal output value and configured to electrically disconnect the switching block junction in response to a second signal output value. Moreover, the configuration bit can comprise a memory circuit comprising a two-terminal non-volatile memory device configured to store a data bit and having an input node and an output node and load circuitry configured to provide the data bit to an input node of the control circuit to facilitate updating the signal output of the control circuit with the data bit.

In still other embodiments, the subject disclosure provides a method for fabricating a configuration bit of a switching block junction. The method can comprise forming a switch at an electrical junction of a switching block and forming a static random access memory (SRAM) circuit having an output connected to an input of the switch. Further, the method can comprise forming a programming circuit comprising a resistive two-terminal memory device connected to an input of the SRAM circuit and forming a first group of signal inputs to facilitate programming, erasing or reading the programming circuit. Furthermore, the method can comprise forming a second group of signal inputs to facilitate updating the output of the SRAM circuit with a data value stored at the programming circuit.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Embodiments of the present disclosure relate to a configuration cell for a field programmable gate array (FPGA) comprising a non-volatile memory. Disclosed configuration cells can comprise a latching circuit configured to operate with the non-volatile memory, or multiple non-volatile memories. In one or more embodiments, the non-volatile memory can be a resistive switching memory (e.g., a resistive random access memory (RRAM), a phase change memory, a magneto-resistive memory, and so forth). The latching circuit can be configured to open or close a junction switch of the FPGA, depending on a state of the latching circuit. The state of the latching circuit can, in turn, be set according to a value stored at the non-volatile memory.

In various embodiments, an array of configuration cells comprising non-volatile memories can be powered-on and programmed concurrently. When power is supplied to a set of latching circuits, their states can be set (or not set) based on a value stored in associated non-volatile memories. Worded differently, the set of latching circuits can be programmed upon power-up according to values previously stored in the non-volatile memories, enabling a very rapid initialization of the FPGA.

In further embodiments, the non-volatile memories can be embedded as part of the logic process circuitry of the FPGA. Accordingly, the FPGA can mitigate or avoid a need for external Flash memory for initialization of routing multiplexers, look up tables, or other FPGA switching block applications. The embedded non-volatile memory also provides an integral resistance to data loss from unexpected power loss, or the like.

More generally, a field programmable gate array (FPGA) is an integrated circuit that can be configured after manufacturing. It is a flexible device having a great number of potential configuration modes to interact with various other hardware and software designs (e.g., on a computer motherboard). The FPGA configuration is generally specified using a hardware description language, similar to that used for an application specific integrated circuit (ASIC). Generally speaking, an FPGA can be configured to implement most or all logic functions that an ASIC could execute, yet also can be at least partially reconfigured after shipping. Coupled with relatively low design costs typically associated with ASIC design, FPGAs offer significant advantages for a wide array of electronic devices and applications.

The FPGA architecture generally comprises a set of programmable logic components, or logic blocks, and reconfigurable interconnects for selectively connecting a subset of the logic blocks with other subsets thereof. Logic blocks can be configured to execute complex algorithms, or simple logic functions like AND, NAND, NOR, etc. Many FPGAs can also include memory elements. Examples of suitable memory elements can include flip-flops, memory registers, memory arrays, and so forth.

Figure 4:
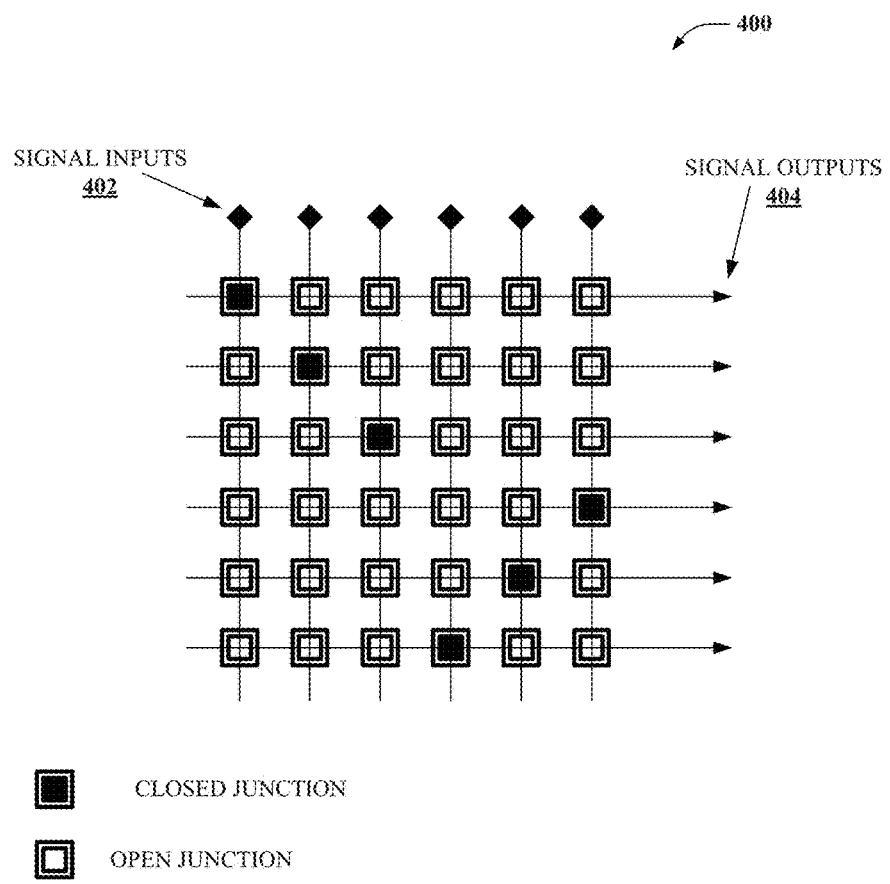
FIG. 4 illustrates a diagram of an example configuration map for an array of junction nodes in a FPGA, according to one or more embodiments.

One fundamental component of an FPGA is the programmable switching block, which acts as a programmable signal routing matrix (e.g., see FIG. 4, infra). A switching block comprises a set of parallel signal input lines intersected by a set of perpendicular signal output lines. At a junction of respective signal input lines and signal output lines is a switch controlled by a configuration cell (also referred to herein as a configuration bit). Selective activation or deactivation of subsets of configuration cell switches at respective signal input/signal output junctions facilitates selective programming of the programmable switching block. Particularly, a configuration cell at a given junction can be activated to electrically connect or route a signal input line to a signal output line at that junction, or can be deactivated to electrically isolate the signal input line and signal output line at that junction. The ability to activate or deactivate respective junctions facilitates programming of the programmable switching block. Examples of programmable switching blocks and innovative mechanisms for FPGA configuration can be found in the following U.S. patents and U.S. patent applications incorporated by reference herein: U.S. Pat. No. 8,754,671 issued from U.S. application Ser. No. 13/194,479 filed Jul. 29, 2011, U.S. Pat. No. 8,674,724 issued from U.S. application Ser. No. 13/194,500 filed Jul. 29, 2011, U.S. Pat. No. 9,054,702B2 issued from U.S. patent application Ser. No. 14/304,572 filed Jun. 13, 2014, U.S. Pat. No. 9,191,000 issued from U.S. application Ser. No. 14/166,700 filed Feb. 28, 2014, U.S. patent application Ser. No. 14/335,507 filed Jul. 18, 2014.

Figure 1:
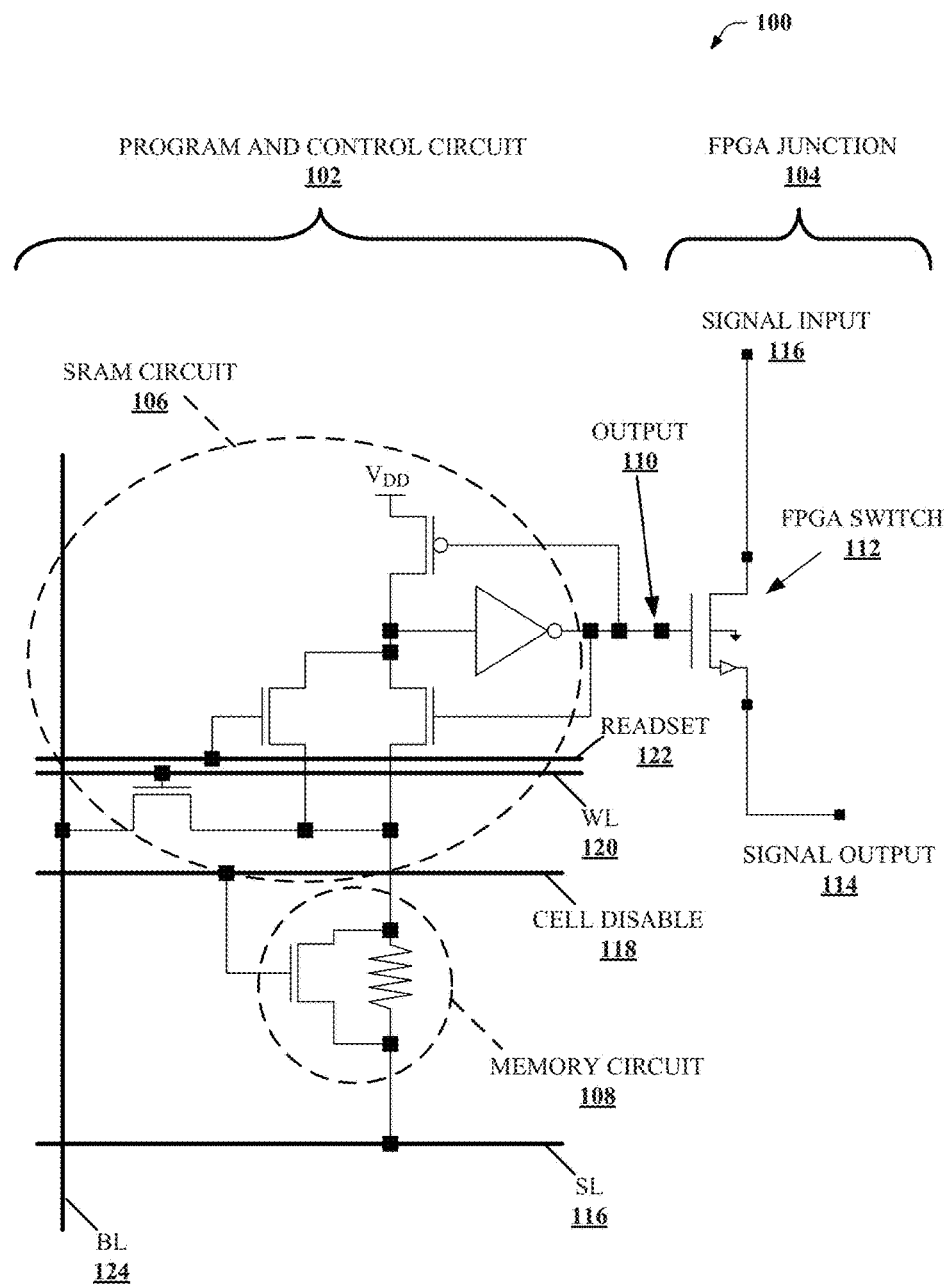
FIG. 1 depicts a circuit diagram of a sample program and control circuit for a field programmable gate array (FPGA) switch, in one or more embodiments.

Referring now to the drawings, FIG. 1 illustrates a schematic diagram of a sample configuration cell 100 for an FPGA according to one or more embodiments of the present disclosure. Configuration cell 100 can comprise a program and control circuit 102 configured to control a state of an FPGA junction 104 (see, e.g., FIG. 4, infra). An FPGA switch 112 is provided at an intersection of the FPGA junction 104; moreover, the FPGA switch 112 can be configured to control the state of the FPGA junction 104. As one example, when activated (e.g., conducting current) the FPGA switch 112 can result in a closed state (e.g., connected state, conducting state, etc.) of the FPGA junction 104. In contrast, when deactivated (e.g., resisting current) the FPGA switch 112 can cause an open state (e.g., disconnected state, non-conducting state, and so forth) of the FPGA junction 104.

An output 110 of the program and control circuit 102 can be configured to activate or deactivate FPGA switch 112. Accordingly, by suitable operation of the program and control circuit 102 as described herein or as known to one of ordinary skill in the art (or made known to the person of ordinary skill by way of the context provided herein), FPGA junction 104 can be opened to the open state, or closed to the closed state. Program and control circuit 102 comprises an SRAM circuit 106 in conjunction with a memory circuit 108. Output 110 is determined by a state of SRAM circuit 106, which in turn can be set or reset in part by a value stored at memory circuit 108. A sourceline (SL) 116, cell disable line 118, wordline 120, readset 122 and bitline 124 facilitate programming memory circuit 108, setting or resetting SRAM circuit 106 or a combination thereof, as described herein.

Figure 12:
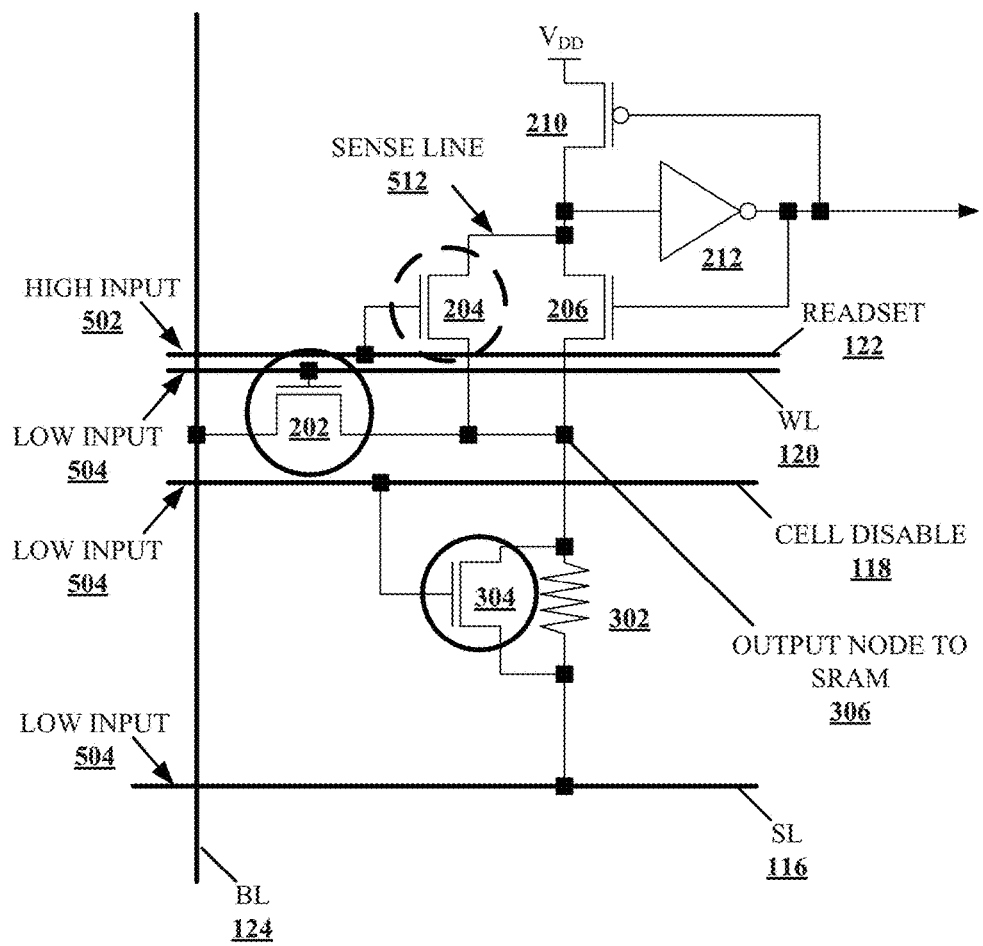
FIG. 12 illustrates a circuit diagram of an example SRAM load operation for a program and control circuit disclosed herein, in an embodiment.

According to various disclosed embodiments, memory circuit 108 can comprise non-volatile memory facilitating storage of data that is resistant to power loss, radiation immune, facilitates fast programming speeds and very fast power up for an FPGA device. As one example, memory circuit 108 can comprise a two-terminal resistive switching memory (e.g., a RRAM, a phase change memory, a magneto-resistive memory, a conductive bridging memory, and so on). A data value stored at the memory circuit 108 can be utilized in part as a set/reset input to SRAM circuit 106. Accordingly, when SRAM circuit 106 is suitably powered (e.g., see FIGS. 2 and 12, infra), the data value stored at memory circuit 108 can be loaded into SRAM circuit 106 to facilitate setting or resetting SRAM circuit 106. The setting/resetting of SRAM circuit 106 can be conducted very rapidly upon application of suitable power to program and control circuit 102 (e.g., as illustrated in FIG. 12), accomplishing the very fast power up. When such a procedure is implemented for an array of program and control circuits 102 (not depicted) operable in conjunction with a programmable switching block comprising a set of FPGA junctions 104, a matrix of open state/closed state conditions can be rapidly programmed to the programmable switching block (e.g., see FIG. 4, infra), facilitating fast power up of the FPGA device itself.

Figure 2:
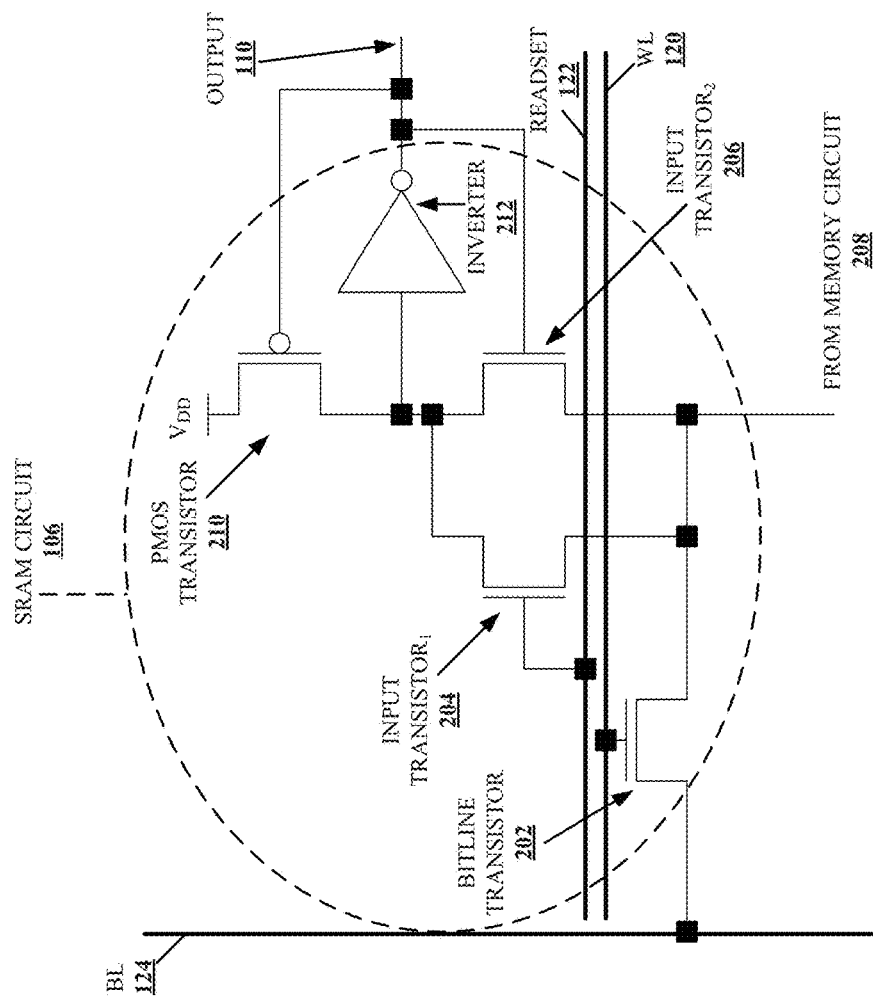
FIG. 2 illustrates a circuit diagram of a sample static random access memory (SRAM) circuit for the program and control circuit of FIG. 1.

FIG. 2 illustrates a circuit diagram of a sample SRAM circuit 106 according to further embodiments. SRAM circuit 106 can be implemented substantially as illustrated in FIG. 1 in one or more embodiments. Other implementations known to one of ordinary skill in the art or made known to one of ordinary skill by way of the context provided herein are considered within the scope of the present disclosure.

SRAM circuit 106 can comprise a bitline transistor 202, a first input transistor: input transistor$_1$ 204, and a second input transistor: input transistor$_2$ 206. Bitline transistor 202 can connect or disconnect bitline 124 from respective first terminals of input transistor$_1$ 204 and input transistor$_2$ 206, to facilitate various operations of SRAM circuit 106. Bitline transistor 202 is operable in response to a signal on wordline 120. Additionally, an input from a memory circuit 208 is also connected to the first terminals of input transistor$_1$ 204 and input transistor$_2$ 206. Further, a control gate of input transistor$_1$ 204 is controlled by readset line 122.

Outputs of input transistor$_1$ 204 and input transistor$_2$ 206 are connected to an input of an inverter 212 and to a source (or drain) of a PMOS transistor 210. Further, an output 110 of inverter 212 controls a control gate of input transistor$_2$ 206, as well as a gate of PMOS transistor 210. Moreover, output 110 serves as an output of SRAM circuit 106. A supply voltage $V_{SS}$ is connected to a drain (or source) of PMOS transistor 210. Accordingly, when an output of inverter 212 is low, input transistor$_2$ 206 is deactivated and PMOS transistor 210 is activated, connecting the supply voltage $V_{SS}$ (e.g., a high input) to inverter 212 (in at least one alternative embodiment, however, supply voltage $V_{SS}$ can deliver a low voltage or ground as an alternative mechanism to reset inverter 212). This high input can be maintained to the input of inverter 212 absent a suitable change to SRAM circuit 106 to drain the supply voltage from the input of inverter 212, as one example. When output 110 is high, PMOS transistor 210 is deactivated, disconnecting the supply voltage from the input of inverter 212. Moreover, input transistor$_2$ 206 is activated, connecting the input from the memory circuit 208 to the input of inverter 212.

Figure 3:
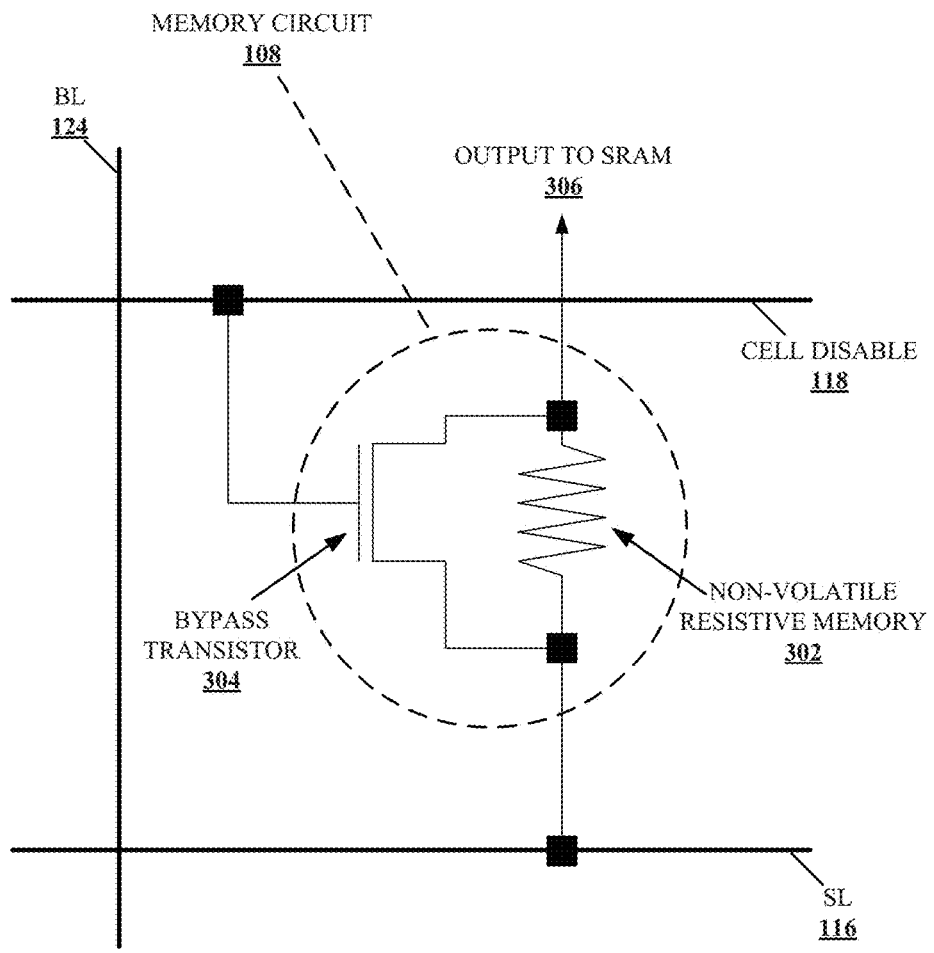
FIG. 3 depicts a circuit diagram of a sample memory circuit for the program and control circuit of FIG. 1, in a further embodiment.

FIG. 3 depicts a circuit diagram of a sample memory circuit 108 according to one or more additional embodiments of the present disclosure. Memory circuit 108 can be implemented substantially as illustrated in FIG. 1 in one or more embodiments. In other embodiments, memory circuit 108 can be implemented in alternative or additional manners as known in the art or made known to one of ordinary skill by way of the context provided herein.

Memory circuit 108 can comprise a non-volatile resistive memory 302 in parallel with a bypass transistor 304. Non-volatile resistive memory 302 can comprise a two-terminal resistive switching memory, in various embodiments. The two-terminal resistive switching memory can be constructed according to CMOS-compatible fabrication techniques, in one or more embodiments. Some non-limiting examples of CMOS compatible fabrication or back-end-of-line fabrication can be found in U.S. Pat. No. 8,198,144 issued from U.S. patent application Ser. No. 13/158,231 filed Jun. 10, 2011, incorporated herein by reference. In alternative or additional embodiments, the two-terminal resistive switching memory can be constructed as part of back-end-of-line CMOS fabrication processes.

The parallel connection of bypass transistor 304 and non-volatile resistive memory 302 connects a source (or drain) of bypass transistor 304 to a first terminal of non-volatile resistive memory 302, and a drain (or source) of bypass transistor 304 to a second terminal of non-volatile resistive memory 302. Additionally, the first terminal of non-volatile resistive memory 302 and source (or drain) of bypass transistor 304 are connected to a sourceline 116, whereas a second terminal of non-volatile resistive memory 302 and drain (or source) of bypass transistor 304 are connected to an output to SRAM 306. A cell disable line 118 controls bypass transistor 304. Non-volatile resistive memory 302 can be programmed, erased or read by deactivating bypass transistor 304, and applying a voltage across non-volatile resistive memory 302. Deactivating bypass transistor 304 serves to route at least a substantial portion of current generated by the voltage through non-volatile resistive memory 302. Such a voltage can be applied at a node connected to the output to SRAM 306 (e.g., through bitline 124 with bitline transistor 202 activated; see FIG. 2, supra) relative to sourceline 116, or vice versa.

FIG. 4 illustrates a block diagram of an example programmable switching block 400 according to one or more aspects of the subject disclosure. In some aspects, programmable switching block 400 can be programmed via configuration cells utilizing embedded non-volatile memory. In at least one embodiment, a suitable configuration cell includes configuration cell 100 of FIG. 1. In further embodiments, the configuration cell can comprise program and control circuit 102 of FIG. 1, which in turn can include SRAM circuit 106 of FIG. 2 and memory circuit 108 of FIG. 3. In another embodiment, an array of these or other suitable configuration cells can be provided for programmable switching block 400, such that respective ones of the array of configuration cells are provided for respective input/output junctions of programmable switching block 400.

Programmable switching block 400 can comprise a set of signal inputs 402 intersecting a set of signal outputs 404 to set of signal inputs 402. In an embodiment, set of signal inputs 402 are substantially perpendicular with set of signal outputs 404, though in other embodiments non-perpendicular intersections of one or more of signal inputs 402 and one or more of signal outputs 404 is contemplated. Additionally, a configuration cell (e.g., configuration cell 100) is formed at respective junctions of signal input lines 402 and signal output lines 404.

The configuration cell is characterized so that an active output electrically connects one of signal output lines 404 with one of signal input lines 402 at a particular junction (e.g., a closed junction). The configuration cell is also characterized so that a deactivated output electrically disconnects the one signal input line 404 and the one signal input line 402 at the junction (e.g., an open junction). A closed junction is depicted by a black square at the respective junction. An open junction is depicted by a white square at the respective junction.

Respective junctions of programmable switching block 400 can be reprogrammed to other matrix patterns than that depicted by FIG. 4 (e.g., by changing activation/deactivation states of configuration cells positioned at the respective junctions). Thus, although a particular matrix pattern is depicted by the closed junctions and open junctions of FIG. 4, the depicted example is but one matrix pattern for programmable switching block 400; programmable switching block 400 can be programmed to many other matrix pattern. Further, it should be understood that programmable switching block 400 can be reprogrammed in the field, for FPGA applications.

In addition to the foregoing, in at least some aspects of the subject disclosure, programmable switching block 400 can have bidirectional signal inputs and signal outputs. Said differently, one (or more) of signal outputs 404 can initiate a signal, which can be received at a corresponding one (or more) of signal inputs 402. As described herein, whether this signal is received or not received at the signal input is determined from a configuration state of an associated configuration cell. If the associated configuration cell is configured as a closed circuit, a signal (e.g., having a threshold current, charge or voltage magnitude) can be detected at the corresponding signal input; otherwise, the signal (e.g., having the threshold current/charge/voltage magnitude) is not detected. Therefore, although programmable switching block 400 identifies vertical lines as signal inputs 402 and horizontal lines as signal outputs 404, it should be appreciated that in the above-described aspects signal inputs 402 and signal outputs 404 can be renamed signal contacts 405 (not depicted) having a first end 405A and second end 405B, that can be employed for either transmitting or receiving a signal, or both, under suitable conditions (e.g., signals of different frequency, phase, or other suitable distinguishing characteristic could be transmitted concurrently at first end 405A and second end 405B, and received at the corresponding other end 405B and 405A, respectively). In still other embodiments, signal inputs 402 or signal outputs 404 can have different spatial orientations, and need be neither vertical or horizontal, nor parallel among themselves, nor perpendicular to each other.

Figure 5:
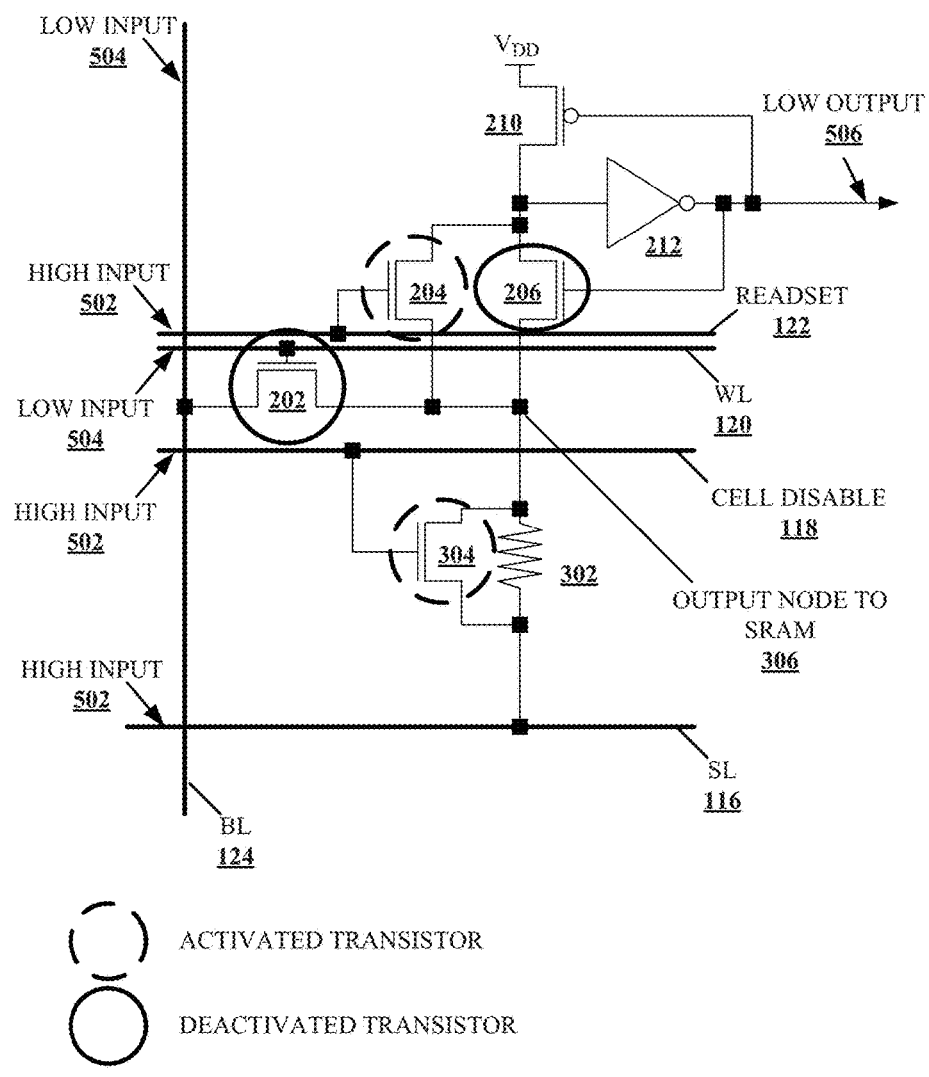
FIG. 5 depicts a circuit diagram of a sample setup operation for a program and control circuit for an FPGA, in further embodiments.

FIG. 5 depicts a circuit diagram of a sample FPGA setup operation 500 according to still other embodiments of the present disclosure. FPGA setup operation 500 can be employed, for instance, to prepare for memory operations pertaining to non-volatile resistive memory 302, to set or reset SRAM circuit 106 (e.g., see FIG. 2), to change output 110, or the like. FPGA setup operation 500 includes applying a high input 502 to readset 122, thereby activating input transistor$_1$ 204, and the high input 502 to cell disable line 118, thereby activating bypass transistor 304. Low input 504 can be applied to wordline 120 to deactivate bitline transistor 202. High input 502 can also be applied to sourcline 116. Activation of bypass transistor 304 connects the high input 502 at sourcline 116 to output node to SRAM 306, which in turn is connected to input of inverter 212 by activation of input transistor$_1$ 204. Accordingly, output of inverter 212 is a low output 506.

Figure 6:
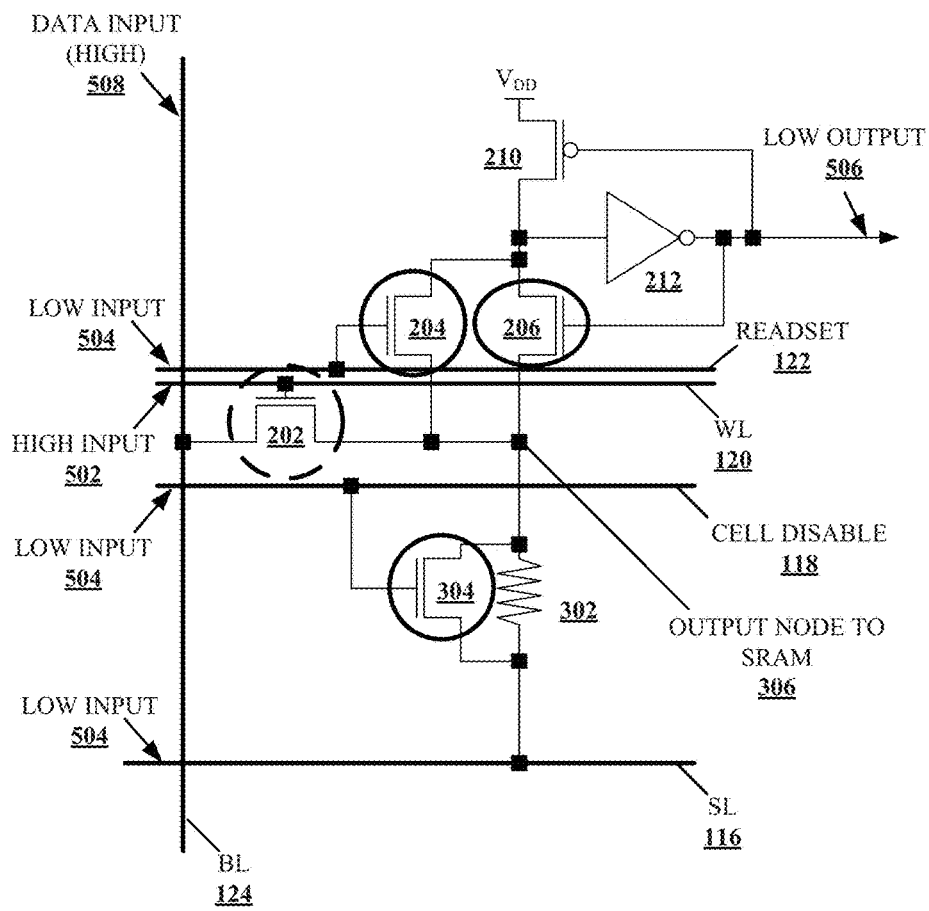
FIG. 6 illustrates a circuit diagram of an example memory program operation for a program and control circuit for an FPGA, in another embodiment.

Referring now to FIG. 6, there is depicted a circuit diagram of an example memory program operation 600, according to further embodiments. Memory program operation 600 comprises a high input 502 at wordline 120, and low inputs 504 at readset 122, cell disable line 118 and sourceline 116. Data input 508 (a high input, for program operation 600) is provided at bitline 124. With such inputs (see FIG. 7, infra), bitline transistor 202 is activated causing the data input 508 from bitline 124 to be connected to output node to SRAM 306, and a second terminal of non-volatile resistive memory 302. Moreover, the low input on sourceline 116 and deactivation of bypass transistor 304 causes a bias across non-volatile resistive memory 302, programming the data input to non-volatile resistive memory 302.

Figure 7:
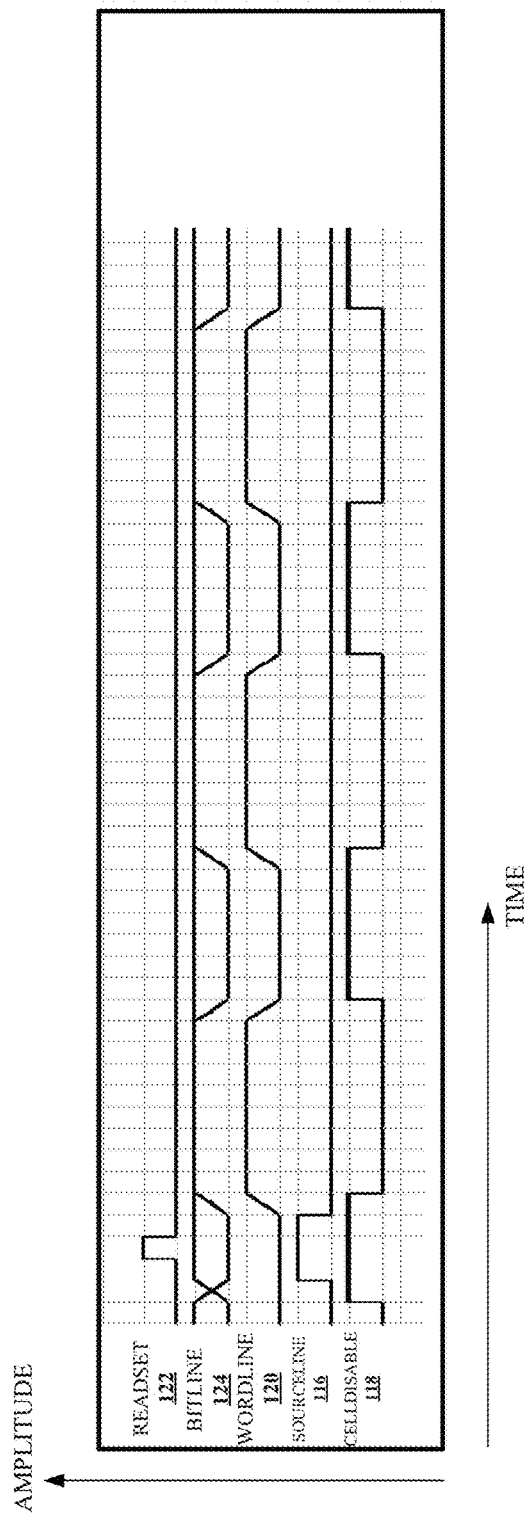
FIG. 7 depicts a chart of an example set of signal timings for the example memory program operation of FIG. 6, in other embodiments.

FIG. 7 depicts a graph of example timing diagrams 700 suitable for memory program operation 600 of FIG. 6. It should be appreciated that other suitable timings—not depicted—could be implemented to achieve programming of non-volatile resistive memory 302, in addition to those depicted by timing diagrams 700. Such suitable timings known in the art or made known to one of skill in the art by way of the context provided herein are considered within the scope of the present disclosure. Timings 700 include signals for readset 122, bitline 124, wordline 120, sourceline 116 and cell disable 118. The signals are displayed with amplitude on a vertical axis, and time on a horizontal axis of the graph.

Figure 7A:
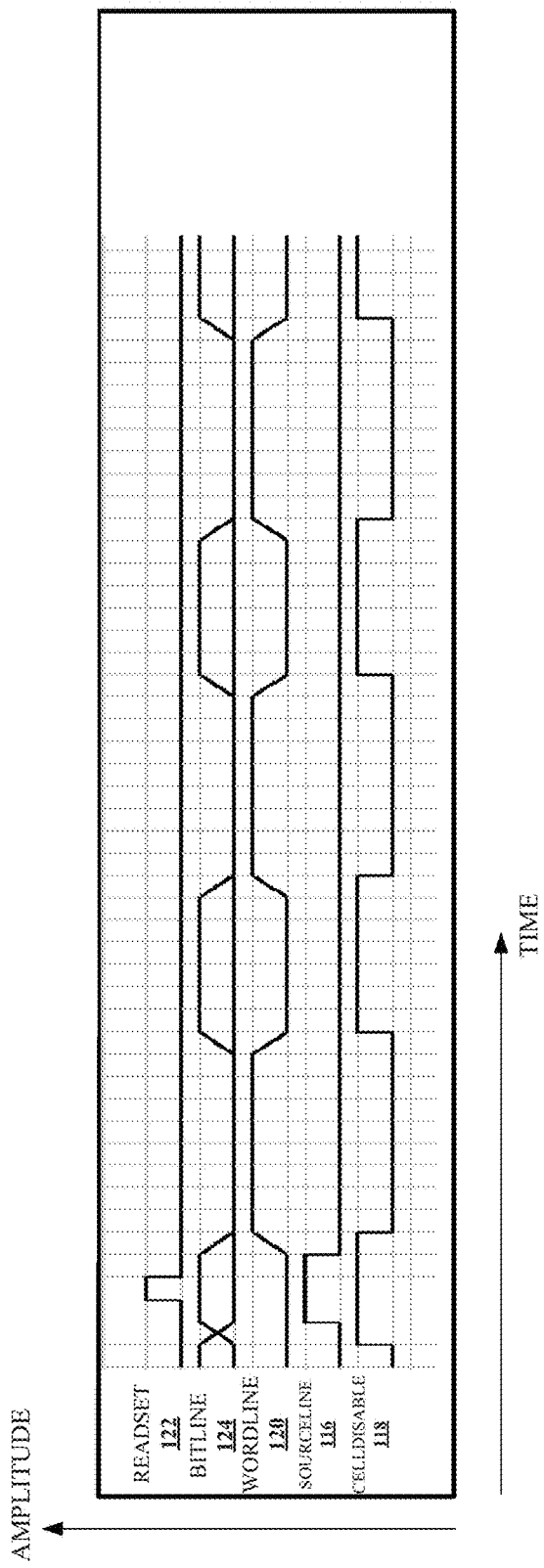
FIG. 7A illustrates a chart of a sample set of signal timings for inhibiting programming for the example memory program operation of FIG. 6, in an embodiment.

FIG. 7A illustrates a graph of example timing diagrams 700A suitable for inhibiting programming of a memory according to the subject disclosure, though it should be appreciated that other suitable timings—not depicted—could be implemented to achieve inhibiting of programming of non-volatile resistive memory 302, in addition to the timings depicted by timing diagrams 700A. Such suitable timings known in the art or made known to one of skill in the art by way of the context provided herein are considered within the scope of the present disclosure. Timings 700A include signals for readset 122, bitline 124, wordline 120, sourceline 116 and cell disable 118. The signals are displayed with amplitude on a vertical axis, and time on a horizontal axis of the graph.

Figure 8:
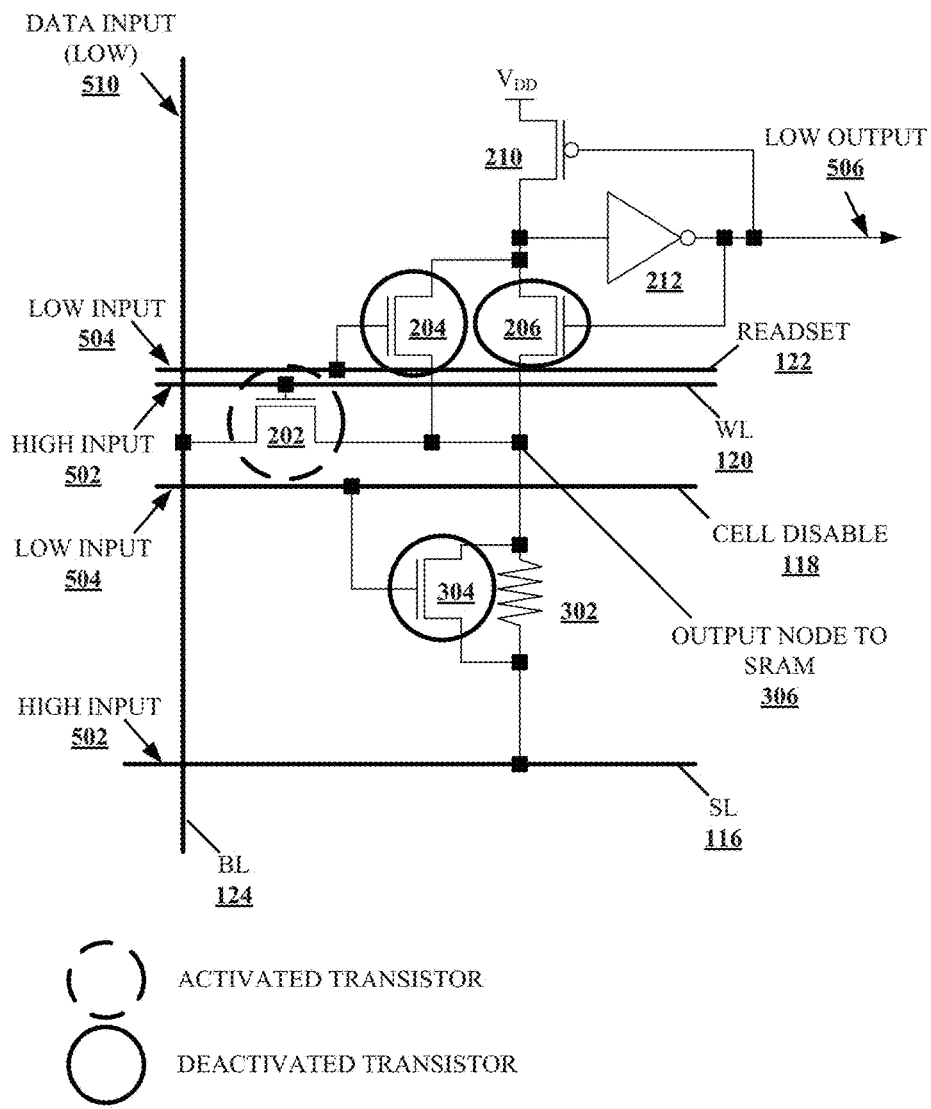
FIG. 8 illustrates a circuit diagram of a sample memory erase operation for a program and control circuit for an FPGA in other embodiments.

FIG. 8 illustrates a circuit diagram of a sample memory erase operation 800 according to one or more embodiments of the subject disclosure. Memory erase operation 800 comprises a high input 502 at wordline 120 and at sourceline 116, and low inputs 504 at readset 122 and cell disable line 118. Data input 510 (a low input, for erase operation 800) is supplied on bitline 510. Activation of bitline transistor 202 connects data input 510 to output node to SRAM 306, and the second terminal of non-volatile resistive memory 302. Low input 504 on sourcline 116 is connected to the first terminal of non-volatile resistive memory 302, and deactivation of bypass transistor 304 facilitates current through non-volatile resistive memory 302, and further facilitates erasing of non-volatile resistive memory 302 (if previously programmed).

Figure 9:
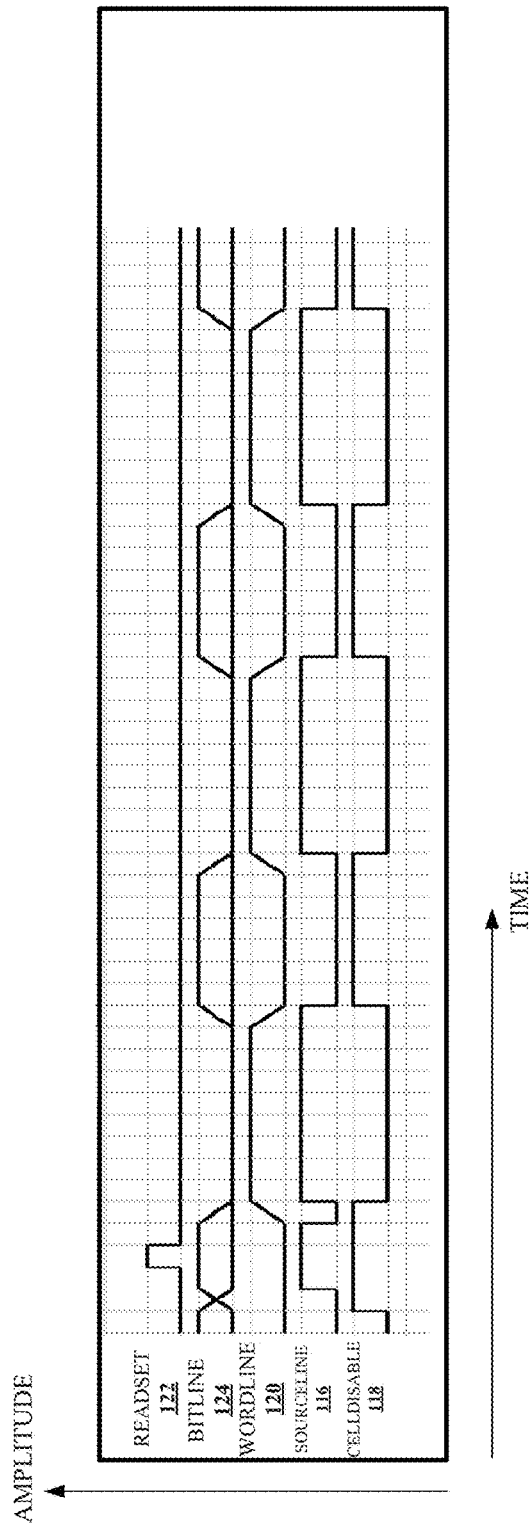
FIG. 9 depicts a chart of example signal timings for the sample erase operation of FIG. 8, in an embodiment.

FIG. 9 illustrates a graph of example timing diagrams 900 suitable for memory erase operation 800 of FIG. 8. Other suitable timings—not depicted—could be implemented to achieve erasing of non-volatile resistive memory 302, in addition to those depicted by timing diagrams 900. Such suitable timings known in the art or made known to one of skill in the art by way of the context provided herein are considered within the scope of the present disclosure. Timings 900 include signals for readset 122, bitline 124, wordline 120, sourceline 116 and cell disable 118. The signals are displayed with amplitude on a vertical axis, and time on a horizontal axis of the graph.

Figure 9A:
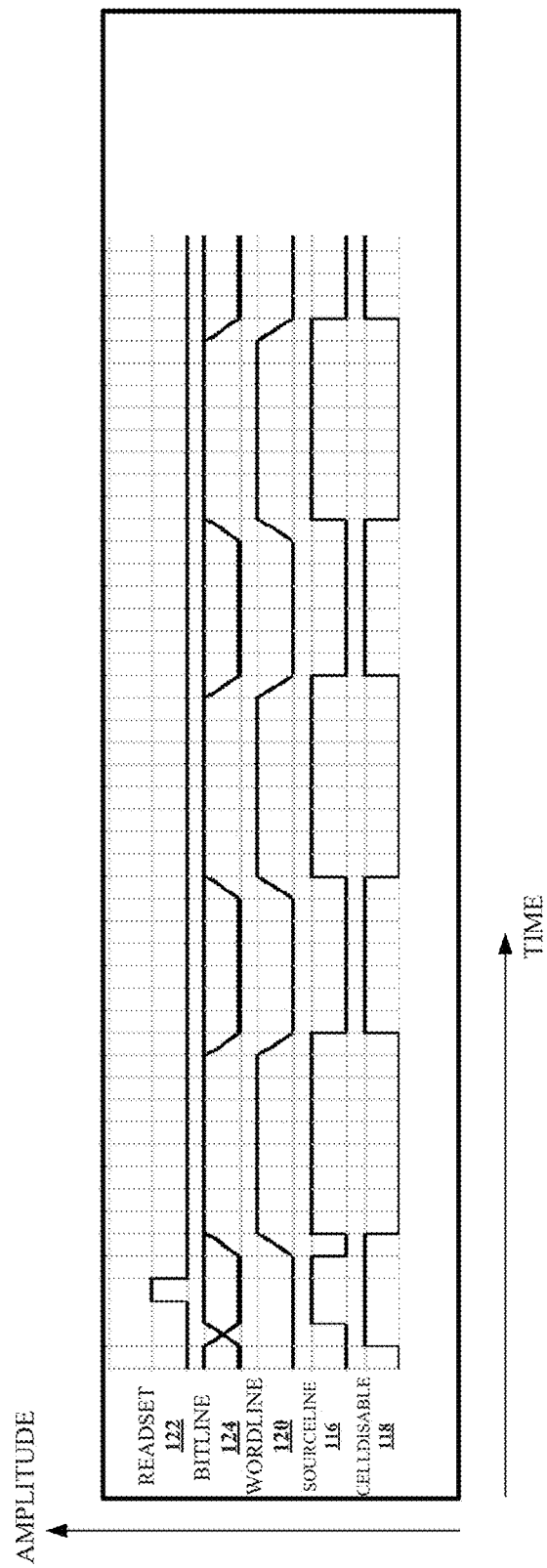
FIG. 9A illustrates a chart of sample signal timings for inhibiting erasing for the sample erase operation of FIG. 8, in further embodiments.

FIG. 9A illustrates a graph of example timing diagrams 900A suitable for inhibiting a memory erase operation for non-volatile resistive memory 302, such as a memory erase operation 800 of FIG. 8. Other suitable timings—not depicted—could be implemented to achieve inhibiting of the erase operation for non-volatile resistive memory 302, in addition to those depicted by timing diagrams 900A. Such suitable timings known in the art or made known to one of skill in the art by way of the context provided herein are considered within the scope of the present disclosure. Timings 900A include signals for readset 122, bitline 124, wordline 120, sourceline 116 and cell disable 118. The signals are displayed with amplitude on a vertical axis, and time on a horizontal axis of the graph.

Figure 10:
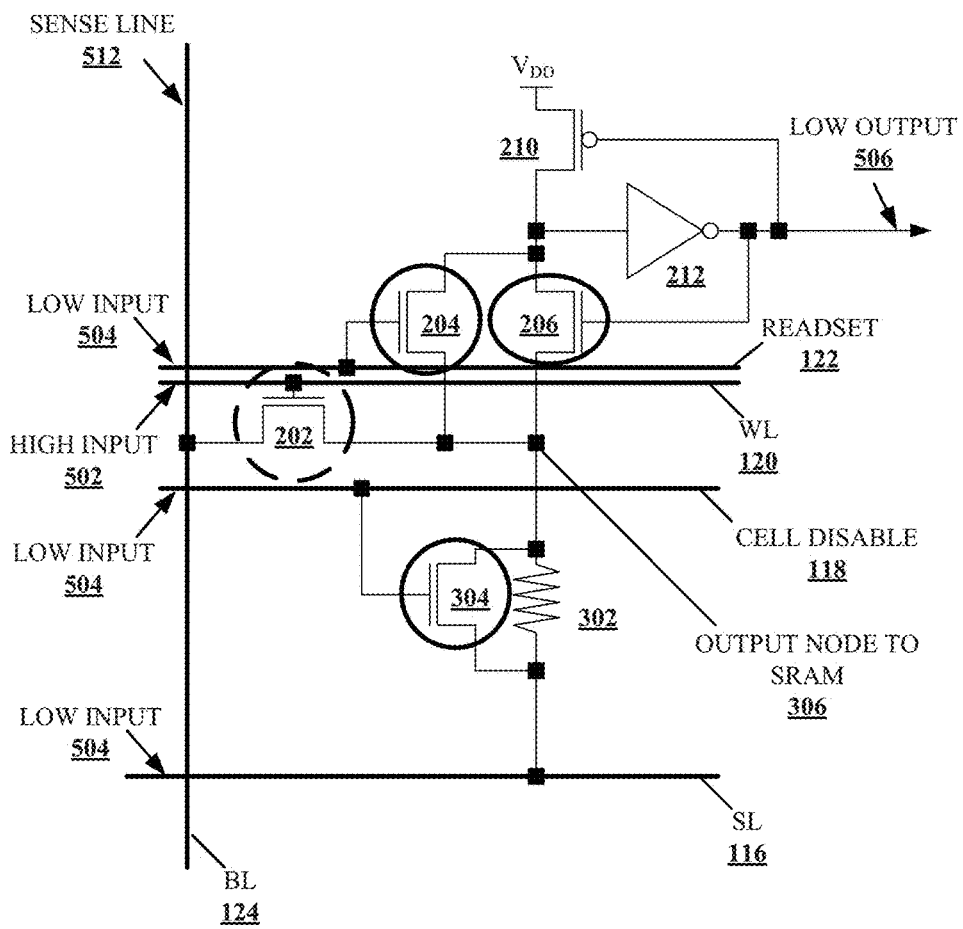
FIG. 10 illustrates a circuit diagram of an example memory read operation for a program and control circuit of an FPGA in yet other embodiments.

FIG. 10 depicts a circuit diagram of an example memory read operation 1000 according to other embodiments disclosed herein. Memory read operation 1000 comprises a high input 502 on wordline 120, and low inputs 504 on readset 122, cell disable line 118 and sourceline 116. In some embodiments, low input 504 on sourceline 116 can be replaced with a read voltage (e.g., having a suitable value selected from between about 0.8 volts and about 2.0 volts, depending on design constraints of non-volatile resistive memory 302). Activation of bitline transistor 202 connects bitline 124 to output node to SRAM 306 and the second terminal of non-volatile resistive memory 302. Deactivation of bypass transistor 304 drives at least a substantial portion of current caused by low input 504 (or the read voltage) on sourceline 116 through non-volatile resistive memory 302. A sense line 512 can be applied to bitline 124 to measure a characteristic (e.g., current, voltage, charge, etc.) of the second terminal of non-volatile resistive memory 302, and read a data value stored thereon.

Figure 11:
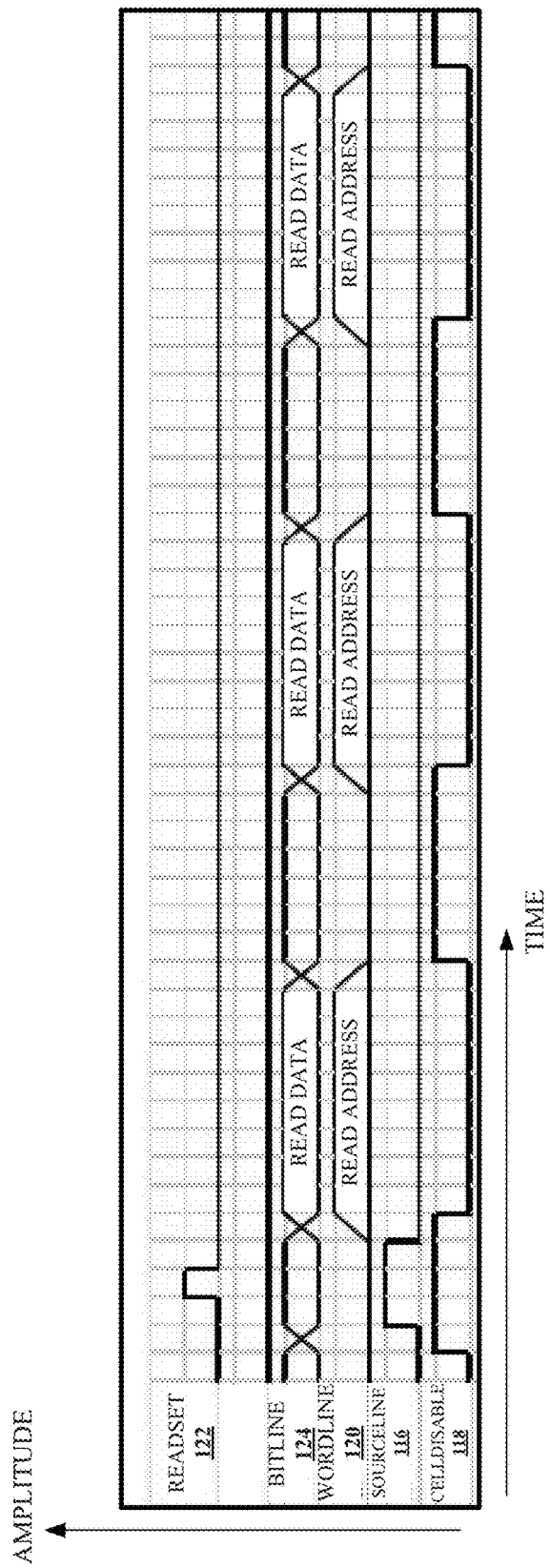
FIG. 11 depicts a chart of example signal timings for the example memory read operation of FIG. 10, in one or more embodiments.

FIG. 11 illustrates a graph of example timing diagrams 1100 suitable for memory erase operation 1000 of FIG. 10. Other suitable timings—not depicted—could be implemented to achieve erasing of non-volatile resistive memory 302, in addition to those depicted by timing diagrams 1100. Such suitable timings known in the art or made known to one of skill in the art by way of the context provided herein are considered within the scope of the present disclosure. Timings 1100 include signals for readset 122, bitline 124, wordline 120, sourceline 116 and cell disable 118. The signals are displayed with amplitude on a vertical axis, and time on a horizontal axis of the graph.

FIG. 12 illustrates a circuit diagram of an example SRAM load operation 1200 according to still other disclosed embodiments. SRAM load operation 1200 comprises high inputs 502 on readset 122, and low inputs on wordline 120, cell disable 118 and sourceline 116. The high input 502 on readset 122 activates input transistor$_1$ 204, thereby connecting output node to SRAM 306 to an input of inverter 212. A voltage stored (or not stored) at non-volatile resistive memory 302 can therefore appear (and be sensed by a sense line 512) at the input of inverter 212. Thus, SRAM load operation 1200 causes a value (high or low) stored at non-volatile resistive memory 302 to be provided to the input of inverter 212. Where the value is high, output 110 of inverter 212 is reset to low; where the value is low, output 110 of inverter 212 is set to high.

Figure 13:
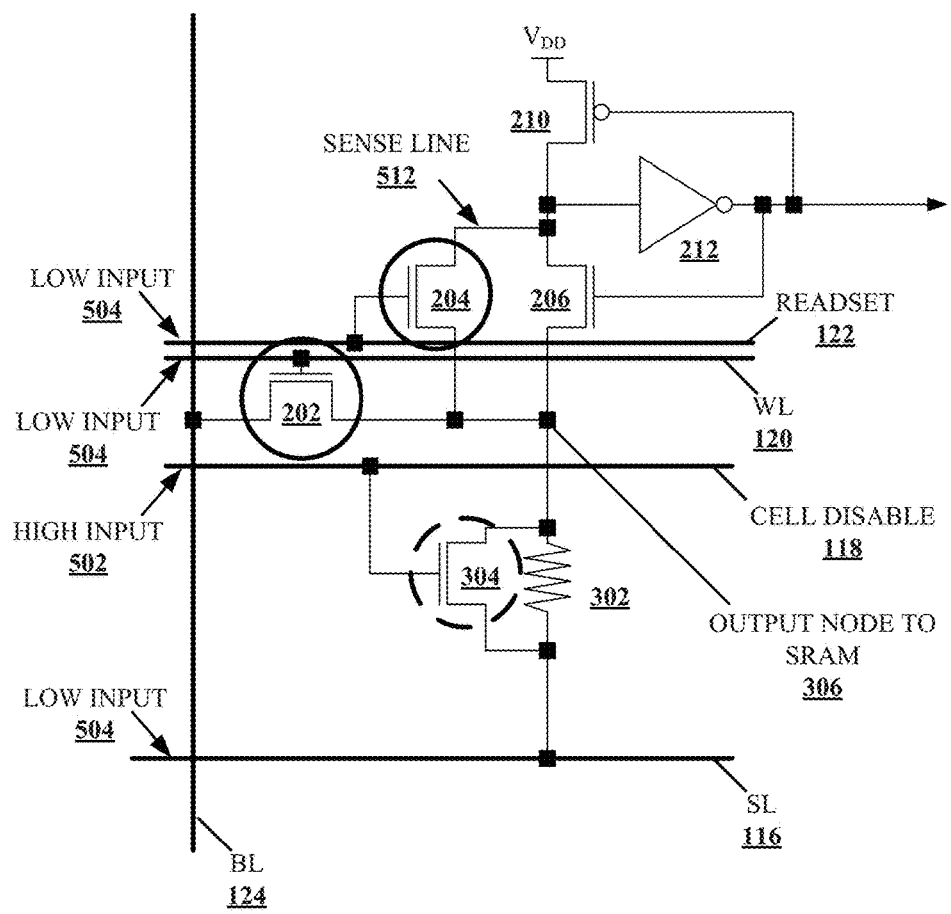
FIG. 13 depicts a circuit diagram of a sample SRAM steady-state mode operation for a disclosed program and control circuit, in further embodiments.

FIG. 13 depicts a circuit diagram of a sample SRAM steady-state mode 1300, according to further embodiments. SRAM steady-state mode 1300 can be utilized by a FPGA configuration cell for reduced power during FPGA operations, system standby, and so forth. SRAM steady-state mode 1300 comprises a high input 502 at cell disable line 118, and low inputs 504 at readset 122, wordline 120 and sourceline 116. Input transistor$_1$ 204 and bitline transistor 202 are therefore deactivated, whereas bypass transistor 304 is activated. Activation of bypass transistor 304 mitigates or avoids data loss at non-volatile resistive memory 302.

Figure 14:
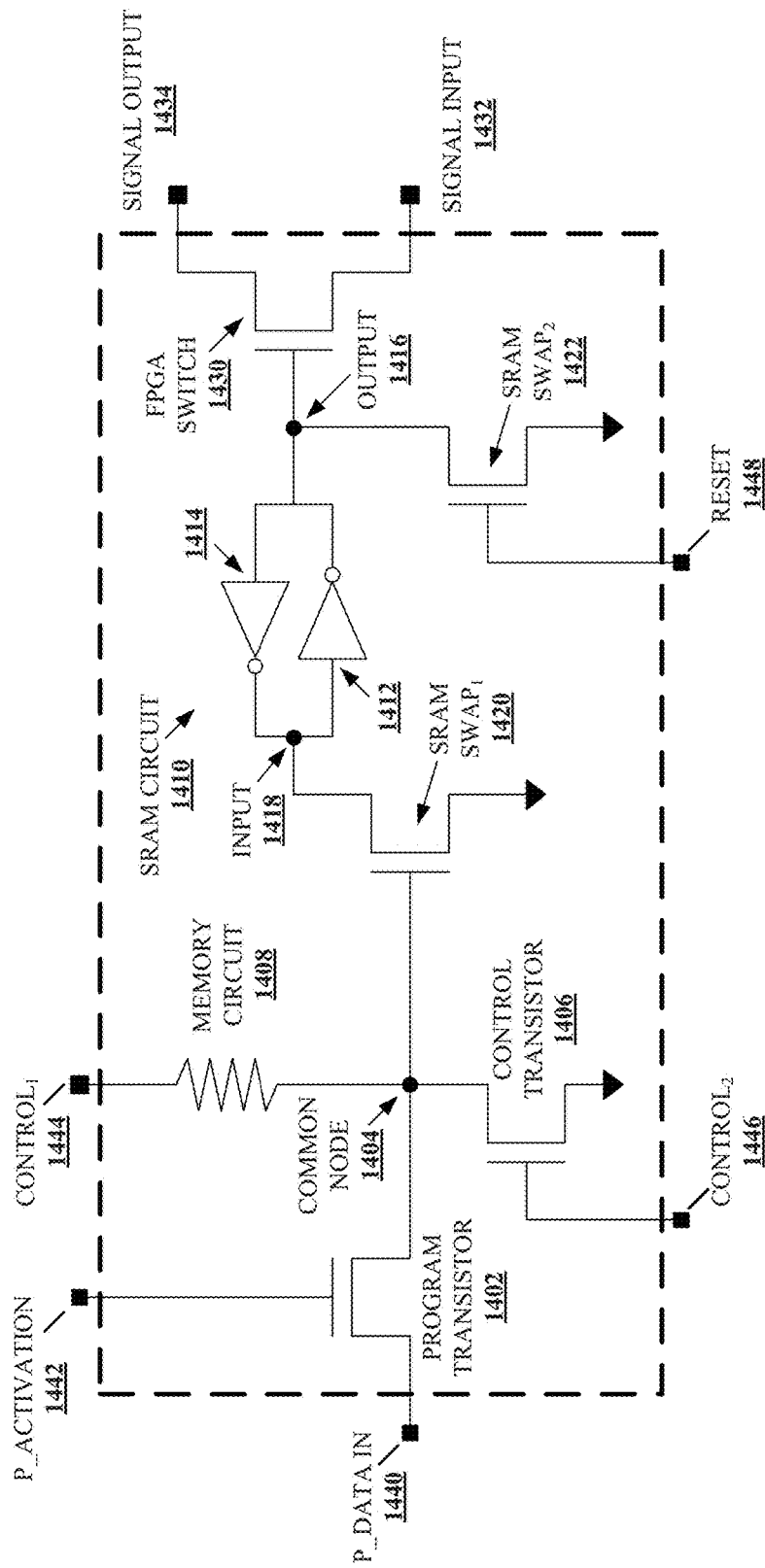
FIG. 14 illustrates a circuit diagram of an example program and control circuit according to additional embodiments of the subject disclosure.

FIG. 14 depicts a program and control circuit 1400 according to alternative or additional embodiments of the present disclosure. Program and control circuit 1400 can comprise a program component that includes a program transistor 1402, a common node 1404, a control transistor 1406 and a memory circuit 1408. The program component can facilitate setting an SRAM circuit 1410, as described in more detail below. SRAM circuit 1410 can have an output 1416 connected to an FPGA switch 1430. A signal output by SRAM circuit 1410 can control the FPGA switch 1430, thereby connecting or disconnecting a signal output 1434 and a signal input 1432. In this manner, program and control circuit 1400 can operate as a configuration cell for an FPGA junction, similar to other disclosure contained herein.

SRAM circuit 1410 is configured to hold either a high signal or a low signal at output 1416. The high signal activates FPGA switch 1430 thereby electrically connecting signal output 1434 and signal input 1432. The low signal deactivates FPGA switch 1430 thereby electrically disconnecting signal output 1434 and signal input 1432.

SRAM circuit 1410 can comprise two inverters 1412, 1414 in reverse orientation to each other. Particularly, SRAM circuit 1410 is configured such that output 1416 is high when input 1418 is low, and vice versa. An SRAM swap$_1$ transistor 1420 can pull input 1418 low when activated by a high signal at common node 1404 (and when SRAM swap$_2$ transistor 1422 is deactivated; see below). A second swap transistor, SRAM swap$_2$ transistor 1422, can pull output 1416 low when activated by a reset input 1448 (and when SRAM swap$_1$ transistor 1420 is deactivated). The program component of program and control circuit 1400 is operable utilizing a program data input: p_data in 1440, a program activation input: p_activation 1442, a control$_1$ input 1444 and a control$_2$ input 1446, as described in more detail below with respect to FIGS. 15-18.

Figure 15:
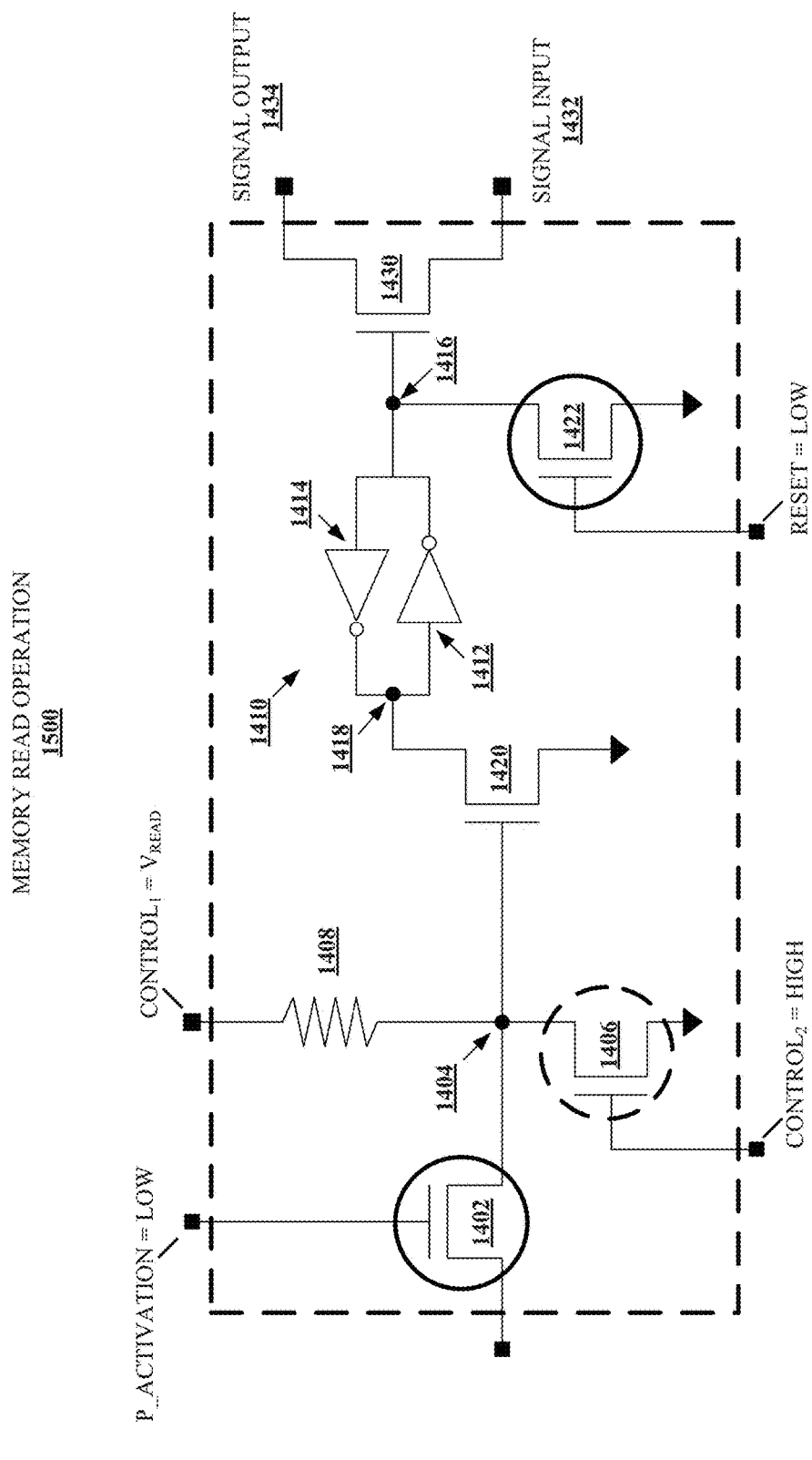
FIG. 15 depicts a circuit diagram of an example memory read operation according to one or more further disclosed embodiments.

FIG. 15 illustrates a circuit diagram of an example memory read operation 1500 for program and control circuit 1400 according to one or more embodiments of the present disclosure. Memory read operation 1500 can comprise providing a low signal at p_activation 1442 to deactivate program transistor 1402. A high signal is applied at control$_2$ input 1446 to activate control transistor 1406, and a read voltage can be applied at control$_1$ input 1444. Electrical characteristics of common node 1404 can be measured to determine whether memory circuit 1408 is programmed (e.g., in a low resistance state) or erased (e.g., in a high resistance state), based on current, voltage, etc., at common node 1404. Note that the read voltage can be selected to have a magnitude less than that required to activate SRAM swap$_1$ transistor 1420. In conjunction with applying a low signal to reset input 1448, memory read operation 1500 can mitigate disturbance of SRAM circuit 1410.

Figure 16:
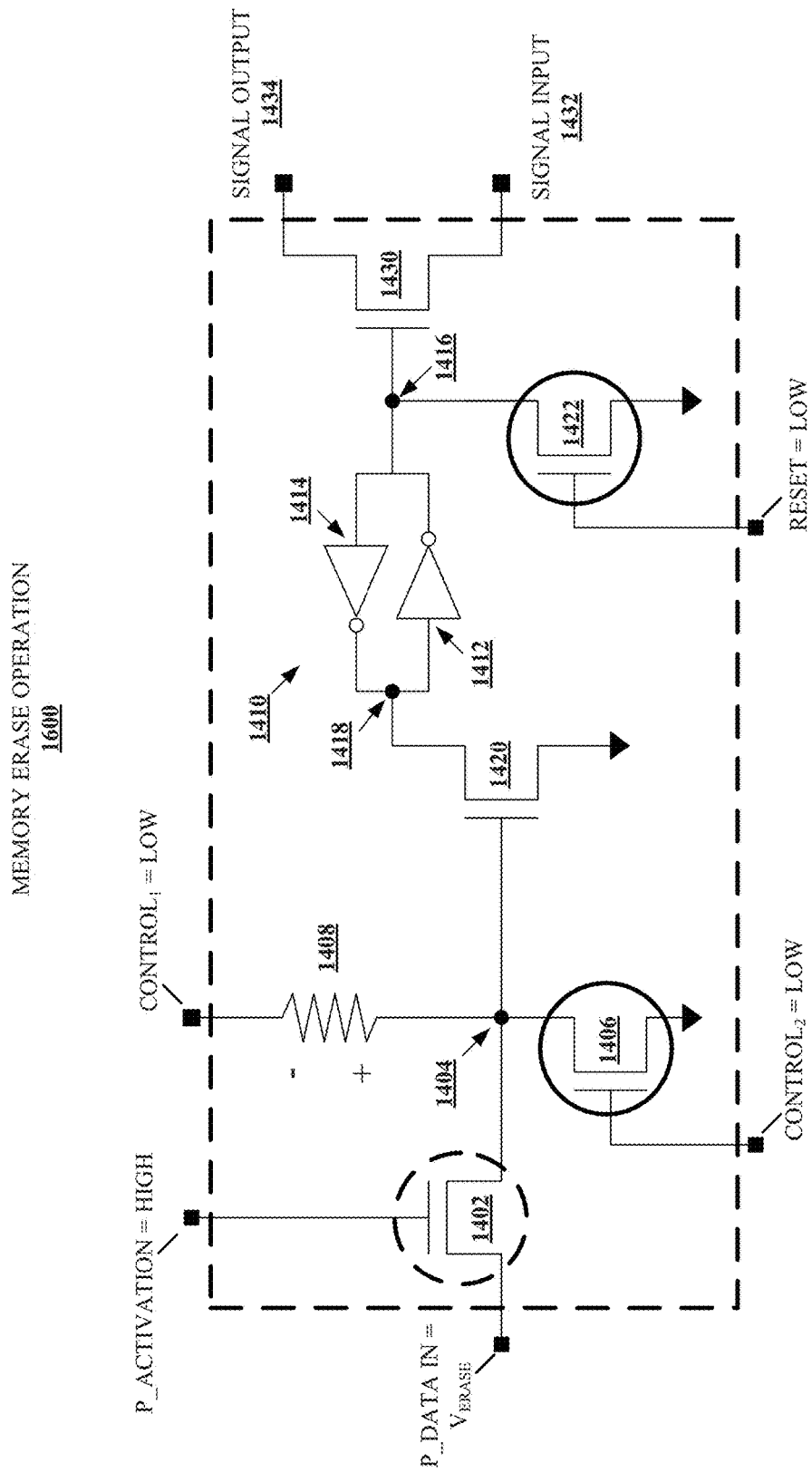
FIG. 16 illustrates a circuit diagram of a sample memory erase operation according to other embodiments.

FIG. 16 depicts a circuit diagram of a sample memory erase operation 1600 for program and control circuit 1400 according to still other disclosed embodiments. Memory erase operation 1600 can comprise a high input at p_activation 1442, and low inputs at control$_1$ input 1444 and control$_2$ input 1446, as well as at reset input 1448. Accordingly, SRAM swap$_2$ transistor 1422 is deactivated, control transistor 1406 is deactivated, and program transistor 1402 is activated. An erase voltage (e.g., high signal) is applied at p_data in 1440 and is connected to common node 1404 by activation of program transistor 1402. This causes a voltage differential across memory circuit 1408 with a polarity indicated by the orientation of "+" and "−" annotations. A magnitude of this voltage can be selected to cause memory circuit 1408 to change to an erased state (e.g., if previously programmed).

Figure 17:
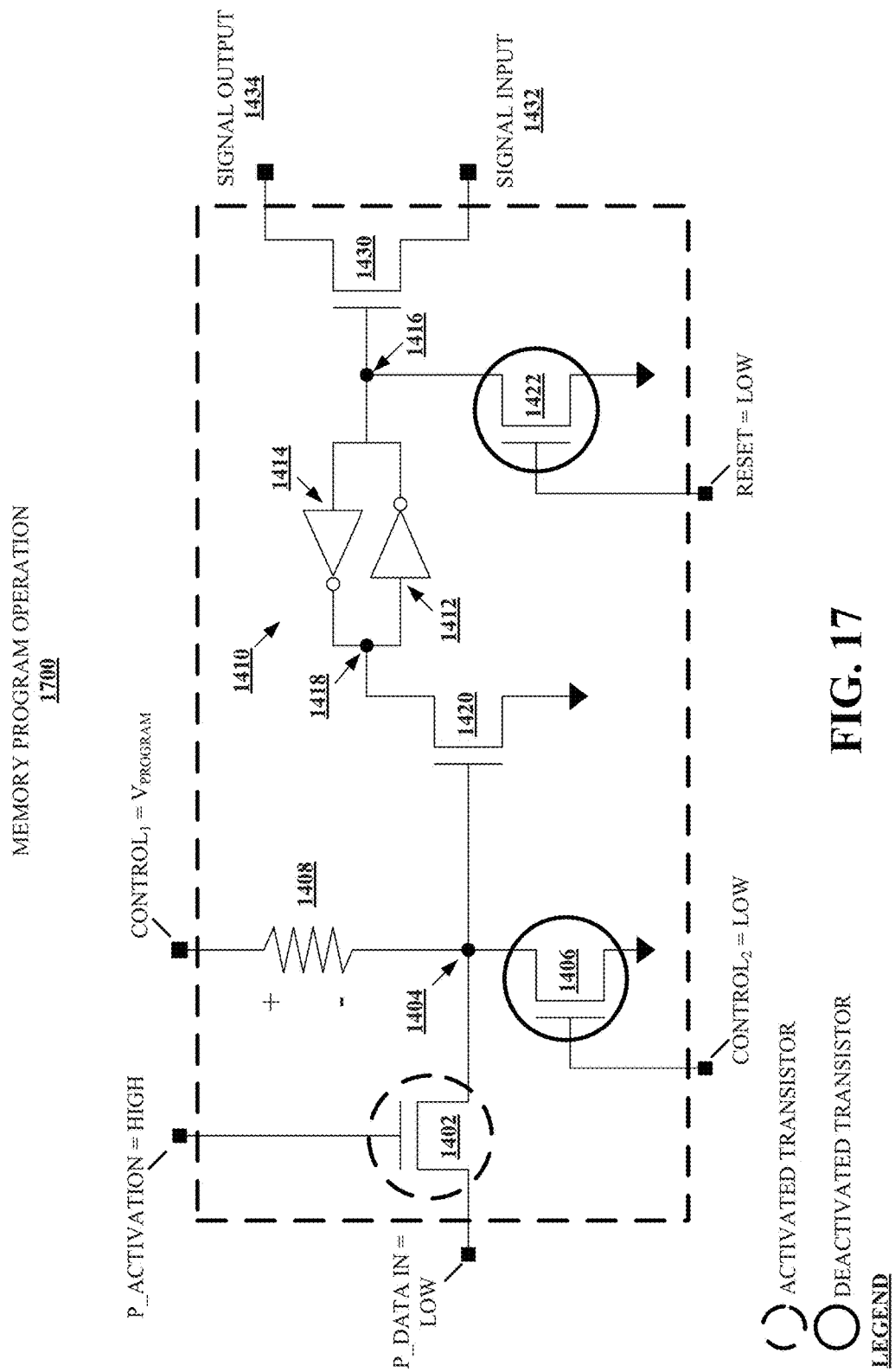
FIG. 17 depicts a circuit diagram of a sample memory program operation according to still other embodiments.

FIG. 17 depicts a circuit diagram of an example memory program operation 1700 for program and control circuit 1400 according to additional embodiments. Memory program operation 1700 can comprise a high input at p_activation 1442, and low inputs at p_data in 1440, at control$_2$ input 1446 and reset input 1448. Accordingly, SRAM swap$_2$ transistor 1422 is deactivated, control transistor 1406 is deactivated and program transistor 1402 is activated. The low input at p_data in 1440 transfers to common node 1404. Further, a program voltage is applied at control$_1$ input 1444, causing a second voltage differential across memory circuit 1408 with a polarity as indicated by the orientation of "+" and "−" annotations. A magnitude of this program voltage can be selected to cause memory circuit 1408 to change to a programmed state (e.g., if previously erased).

Figure 18:
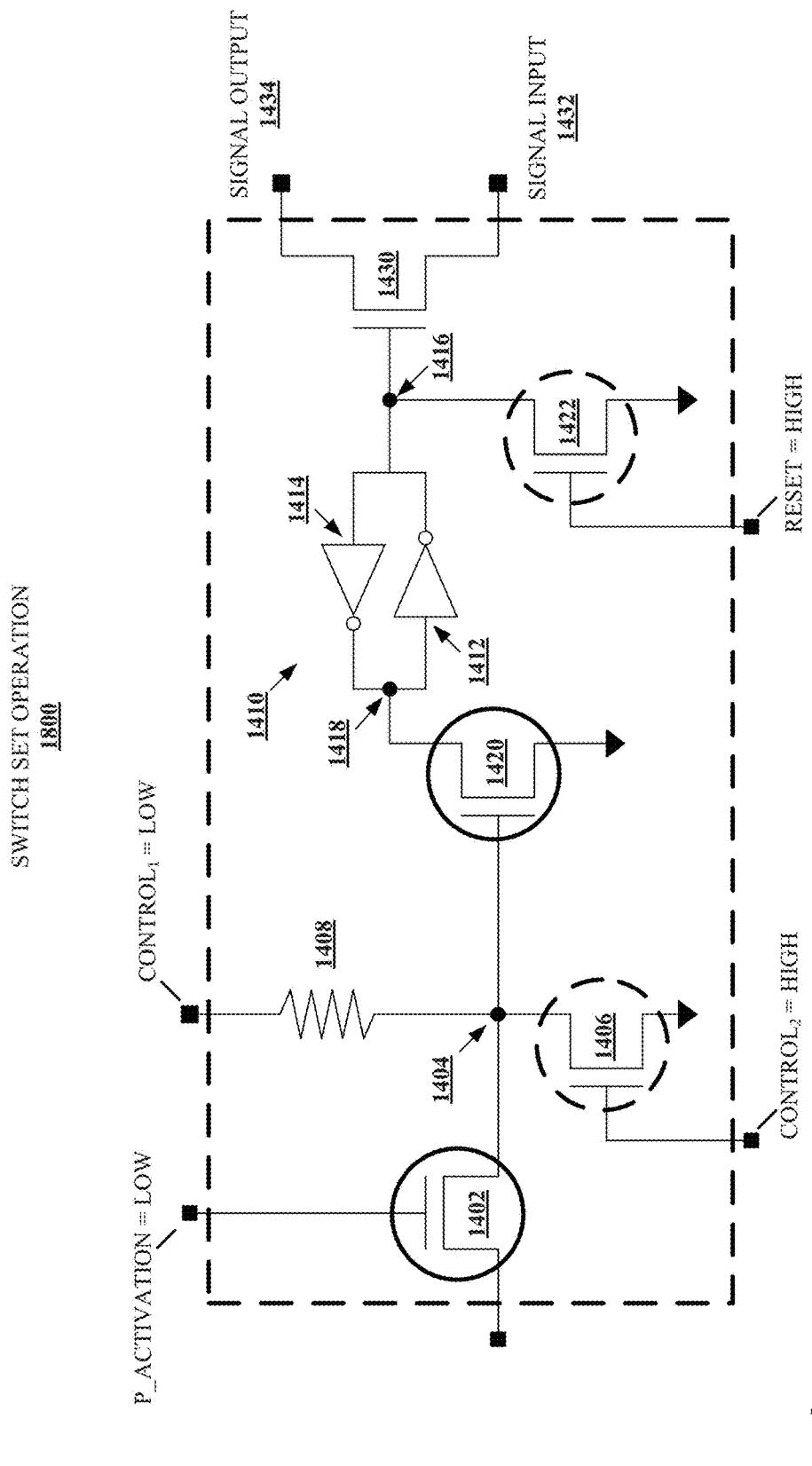
FIG. 18 illustrates a circuit diagram for an example set operation for an FPGA switch according to one or more disclosed embodiments.

FIG. 18 illustrates a circuit diagram of a sample switch set operation 1800 for program and control circuit 1400, according to yet further embodiments. Switch set operation 1800 can comprise a high input at control$_2$ input 1446 and at reset input 1448, and a low input at control$_1$ input 1444 and p_activation 1442. Program transistor 1402 is therefore deactivated, and control transistor 1406 is activated, connecting common node 1404 to ground. As a result, a control gate of SRAM swap$_1$ transistor 1420 is low, deactivating SRAM swap$_1$ transistor 1420 and insulating input 1418 from ground (e.g., and enabling input 1418 to be high). SRAM swap$_2$ transistor 1422 is activated, pulling output 1416 low (and input 1418 high) thereby deactivating FPGA switch 1430.

Figure 19:
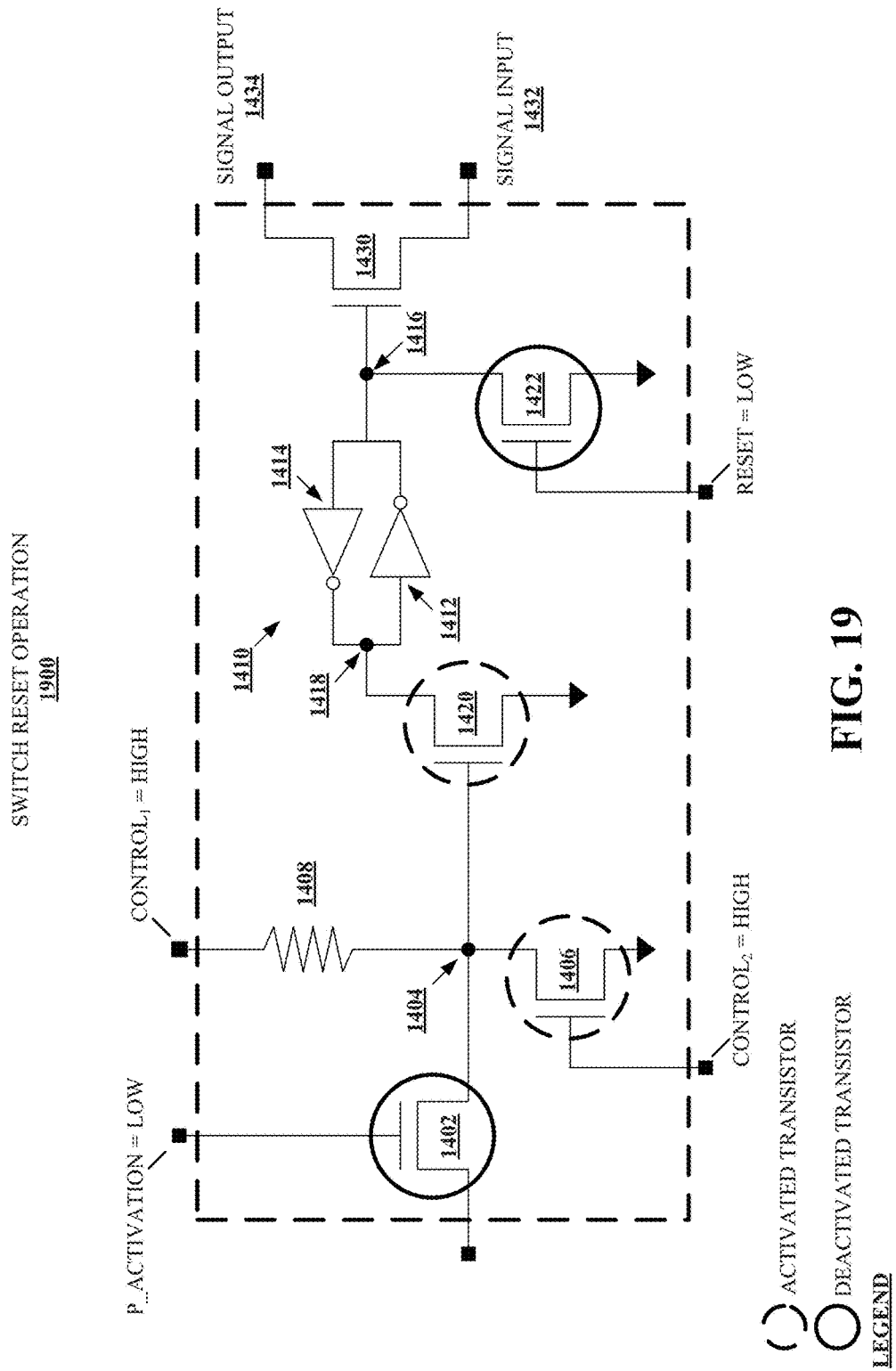
FIG. 19 depicts a circuit diagram for a program and control circuit having multiple non-volatile memory program cells, in another embodiment.

FIG. 19 depicts a circuit diagram of an example switch reset operation 1900 for program and control circuit 1400, according to one or more additional embodiments. Switch set operation 1900 can comprise a high signal at control$_1$ input 1444 and at control$_2$ input 1446, and low signal at p_activation 1442 and reset input 1448. SRAM swap$_2$ transistor 1422 is therefore deactivated (isolating output 1416 from ground), control transistor 1406 is activated and the high signal at control$_1$ input 1444 generates a voltage at 1404, activating SRAM swap$_1$ transistor 1420 and pulling input 1418 low and setting output 1416 high. This in turn activates FPGA switch 1430.

Figure 20:
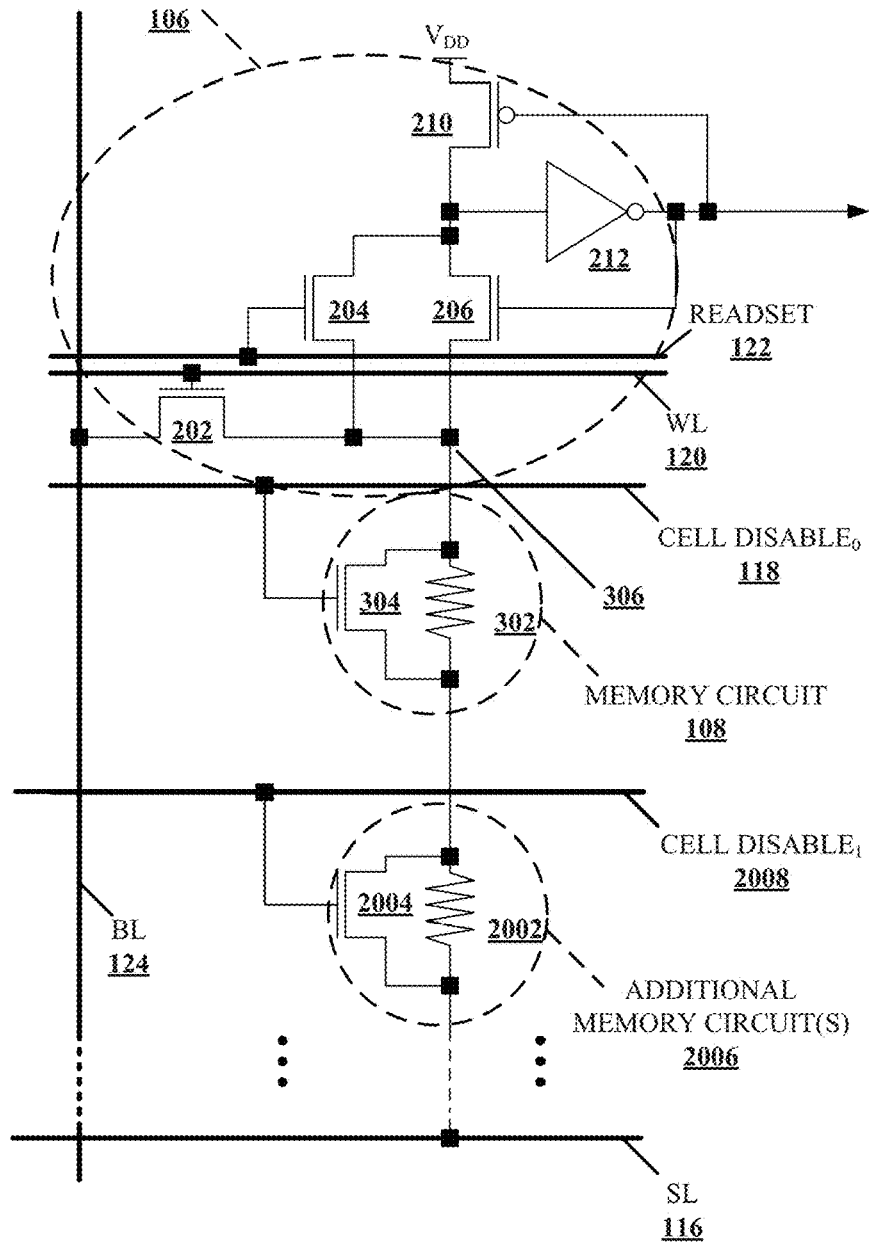
FIG. 20 depicts a circuit diagram of an example configuration bit having multiple non-volatile storage inputs, according to one of more further embodiments.

FIG. 20 depicts a circuit diagram of a multiple memory input circuit 2000 for a program and control circuit according to further embodiments of the present disclosure. Multiple memory input circuit 2000 can comprise additional memory circuits 2006 in series to memory circuit 108. In various embodiments, memory circuit 108 can be substantially similar to that described in FIGS. 1 and 3, supra, with the exception that a first terminal of non-volatile resistive memory 302 and first contact of bypass transistor 304 are connected to additional memory circuit(s) 2006, as depicted (rather than directly to sourceline 116). The additional memory circuits 2006 can respectively comprise a bypass transistor 2004 and non-volatile resistive memory 2002 connected in parallel, having respective second contacts connected to memory circuit 108 and respective first contacts connected to a subsequent memory circuit (not depicted), or to sourceline 116.

To operate (e.g., program, erase, read, etc.) on memory circuit 2006, bypass transistor 304 is activated and bypass transistor 2004 is deactivated. Further, bitline transistor 202 is activated to connect bitline 124 to output node to SRAM 306 and a voltage is applied between sourceline 116 and bitline 124. This directs current through non-volatile resistive memory 2002 to facilitate the memory operation, while bypassing non-volatile resistive memory 302. Accordingly, the memory operation can be implemented on non-volatile resistive memory 2002 without disturbing a data value stored at memory circuit 108 (or other memory circuits—not depicted). Likewise, to operate on memory circuit 108, bypass transistor 2004 is activated—routing current around non-volatile resistive memory 2002—and bypass transistor 304 is deactivated—routing current to non-volatile resistive memory 302. To load a data value from a selected one of memory circuit 108 or one of additional memory circuit(s) 2006 into SRAM circuit 106, a bypass transistor of the selected memory circuit is deactivated, and other bypass circuits of memory circuit 108 or additional memory circuit(s) 2006 are activated. This applies a data value of the selected memory circuit to output node to SRAM 306, and to an input of inverter 212 if input transistor$_1$ is also activated (e.g., see FIG. 2, supra).

By programming memory circuits of multiple memory input circuit 2000 independently, different values can be loaded to respective memory circuits. This can be implemented while other operations are performed on an associated FPGA. Further, because the memory circuits comprise non-volatile resistive memories, the data values can be preserved without continuous application of power, reducing power consumption of the multiple memory input circuit 2000. Moreover, a data value can be loaded from one of the memory circuits very quickly at power up of the FPGA. Although multiple memory input circuit 2000 illustrates two memory circuits, the subject disclosure is not so limited, and additional memory circuits (e.g., N memory circuits, where N is a suitable integer larger than 1) can be provided in series to memory circuit 108 and additional memory circuit(s) 2006 in similar manner as depicted for additional memory circuit(s) 2006.

The aforementioned diagrams have been described with respect to interaction between several components (e.g., memory cells, circuits, etc.) of a program circuit, a memory circuit, or an FPGA architecture comprised of such memory program circuits/memory circuits. It should be appreciated that in some suitable alternative aspects of the subject disclosure, such diagrams can include those components and circuits specified therein, some of the specified components/circuits, or additional components/circuits. Sub-components can also be implemented as electrically connected to other sub-components rather than included within a parent component/circuit. Additionally, it is noted that one or more disclosed processes can be combined into a single process providing aggregate functionality. Components of the disclosed architectures can also interact with one or more other components not specifically described herein but known by those of skill in the art.

Figure 21:
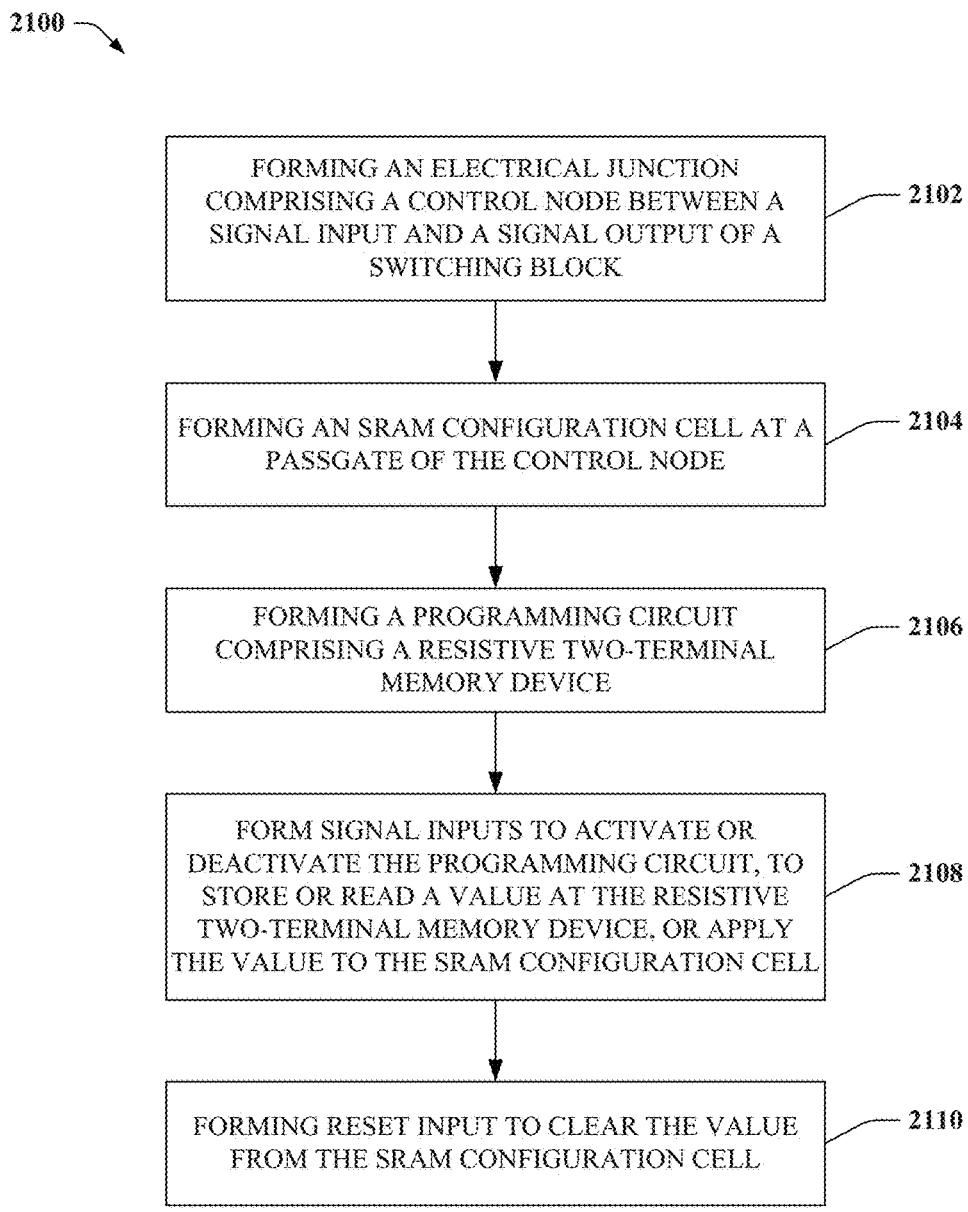
FIG. 21 illustrates a flowchart of a sample method for fabricating a configuration cell for an FPGA junction node, in an embodiment.
Figure 22:
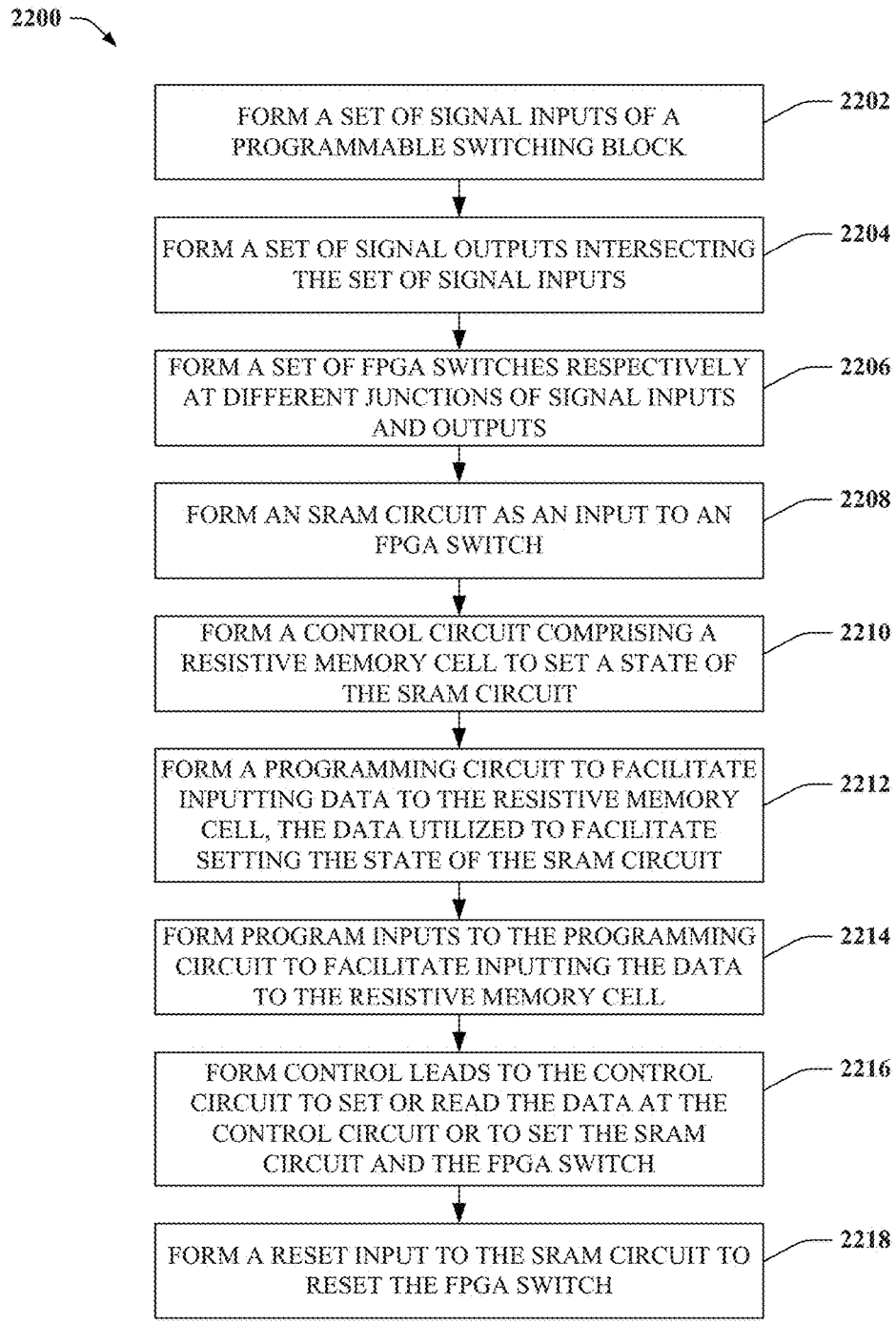
FIG. 22 illustrates a flowchart of an example method for fabricating an FPGA according to one or more other embodiments.

In view of the exemplary diagrams described supra, process methods that can be implemented in accordance with the disclosed subject matter will be better appreciated with reference to the flow charts of FIGS. 21 and 22. While for purposes of simplicity of explanation, the methods of FIGS. 21 and 22 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the disclosed methods. Additionally, it should be further appreciated that some or all of the methods disclosed throughout this specification are capable of being stored on an article of manufacture to facilitate transporting and transferring such methodologies to an electronic device, or being integrated with an apparatus or electronic device (e.g., stored in erasable memory, stored in read only memory, implemented with programmable or non-programmable logic arrays, etc.), or partly stored on an article of manufacture and partly integrated with an apparatus or electronic device. The term article of manufacture, as used, is intended to encompass a computer program accessible from any computer-readable device, device in conjunction with a carrier, or storage medium.

FIG. 21 depicts a flowchart of a sample method 2100 for fabricating a configuration cell of an FPGA junction, according to one or more embodiments. At 2102, method 2100 can comprise forming an electrical junction comprising a control node (e.g., a passgate transistor) between a signal input and a signal output of a switching block. At 2104, method 2100 can comprise forming an SRAM configuration cell having an output connected to a passgate of the control node. At 2106, method 2100 can comprise forming a programming circuit comprising a resistive two-terminal memory device. The programming circuit can further comprise an output node connected to the SRAM configuration cell. At 2108, method 2100 can comprise forming signal inputs to the programming circuit and the SRAM configuration cell. For instance, the signal inputs can include an activation signal input to activate or deactivate the programming circuit. Further, the signal inputs can comprise control inputs to perform memory operations on the resistive two-terminal memory device and to apply a value stored at the two-terminal memory device to the SRAM configuration cell. At 2110, method 2100 can comprise forming a reset input to clear the value from the SRAM configuration cell.

FIG. 22 illustrates a flowchart of a sample method 2200 for fabricating a configuration cell of an FPGA junction according to further embodiments. At 2202, method 2200 can comprise forming a set of signal inputs of a programmable switching block. At 2204, method 2200 can comprise forming a set of signal outputs intersecting the set of signal inputs. Moreover, at 2206, method 2200 can comprise forming a set of FPGA switches respectively at different junctions of the signal inputs and signal outputs. At 2208, method 2200 can comprise forming an SRAM circuit as an input to an FPGA switch. At 2210, method 2200 can comprise forming a control circuit comprising a resistive memory cell configured to set a state of the SRAM circuit. At 2212, method 2200 can comprise forming a programming circuit to facilitate inputting data to the resistive memory cell, wherein the data can be utilized to facilitate setting the state of the SRAM circuit. At 2214, method 2200 can comprise forming program inputs to the programming circuit to facilitate inputting the data to the resistive memory cell. Additionally, at 2216, method 2200 can comprise forming control leads to the control circuit to set or read the data at the control circuit, or to set the SRAM circuit and the FPGA switch. At 2218, method 2200 can comprise forming a reset input to the SRAM circuit to reset the FPGA switch.

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 23 and 24, infra).

NAND FLASH is employed for compact FLASH devices, USB devices, SD cards, solid state drives (SSDs) and storage class memory, as well as other form-factors. Although NAND has proven a successful technology in fueling the drive to scale down to smaller devices and higher chip densities over the past decade, as technology scaled down past 25 nanometer (nm) memory cell technology, the inventors have identified several structural, performance, and reliability problems that became evident to them. One or more of these considerations or similar considerations can be addressed by some or all of the disclosed aspects.

Figure 23:
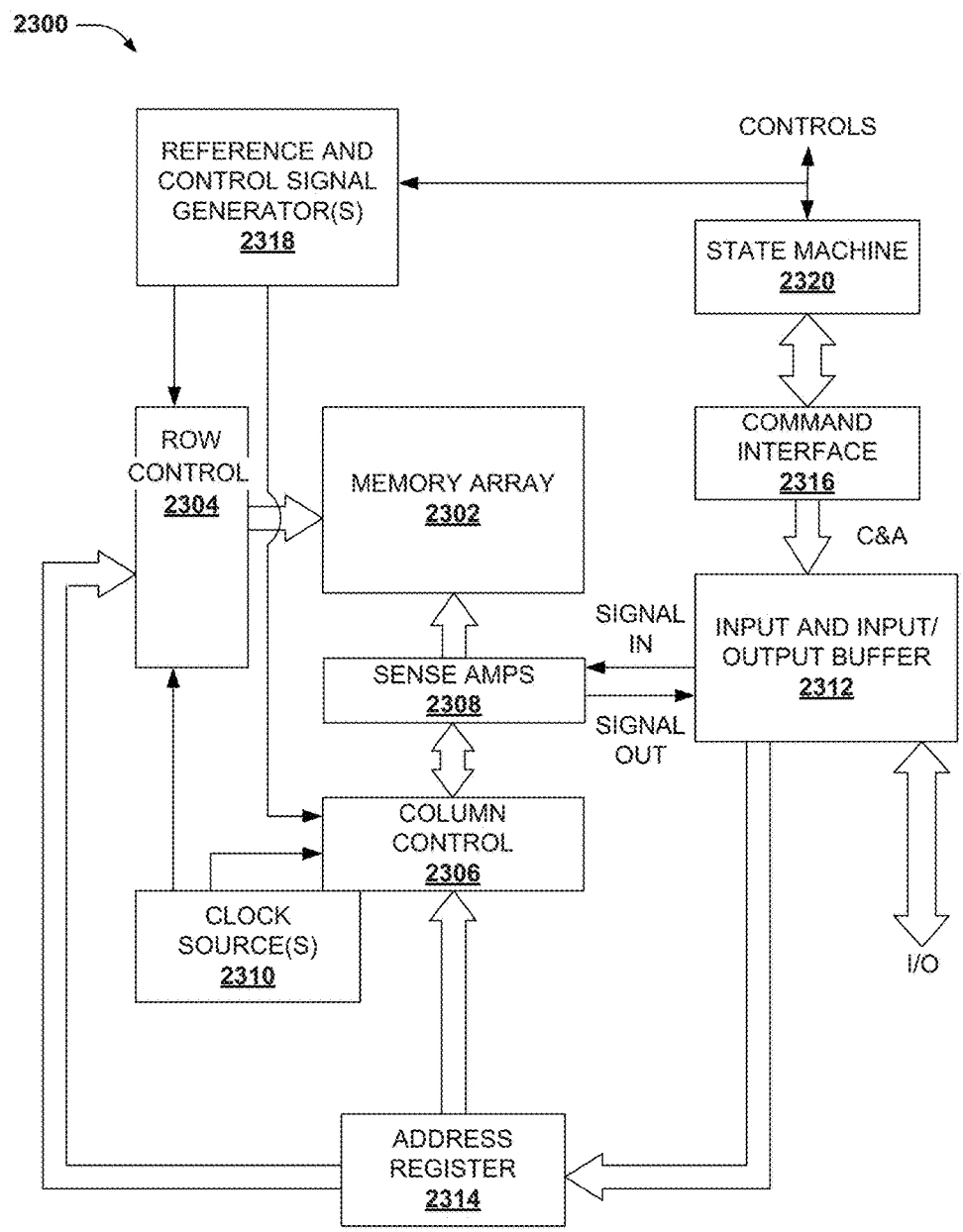
FIG. 23 depicts a block diagram of an example operating and control environment for a memory device according to disclosed embodiments.

In order to provide a context for the various aspects of the disclosed subject matter, FIG. 23, as well as the following discussion, is intended to provide a brief, general description of a suitable environment in which various aspects of the disclosed subject matter can be implemented or processed. While the subject matter has been described above in the general context of electronic memory, circuitry for a configuration cell of an FPGA comprising an electronic memory, and process methods for fabricating or operating the electronic memory and configuration cell circuitry, those skilled in the art will recognize that the subject disclosure also can be implemented in combination with other circuitry, memory architectures or process methodologies. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 23 illustrates a block diagram of an example operating and control environment 2300 for a memory array 2302 according to aspects of the subject disclosure. In at least one aspect of the subject disclosure, memory array 2302 can comprise a variety of memory cell technology. As one example, memory array 2302 can comprise two-terminal memory such as resistive memory cells incorporated within an FPGA configuration cell, as described herein.

A column controller 2306 and sense amps 2308 can be formed adjacent to memory array 2302. Moreover, column controller 2306 can be configured to activate (or identify for activation) a subset of bit lines of memory bank 2302. Column controller 2306 can utilize a control signal provided by a reference and control signal generator(s) 2318 to activate, as well as operate upon, respective ones of the subset of bitlines, applying suitable program, erase or read voltages to those bitlines. Non-activated bitlines can be kept at an inhibit voltage (also applied by reference and control signal generator(s) 2318), to mitigate or avoid bit-disturb effects on these non-activated bitlines.

In addition, operating and control environment 2300 can comprise a row controller 2304. Row controller 2304 can be formed adjacent to and electrically connected with word lines of memory array 2302. Also utilizing control signals of reference and control signal generator(s) 2318, row controller 2304 can select particular rows of memory cells with a suitable selection voltage. Moreover, row controller 2304 can facilitate program, erase or read operations by applying suitable voltages at selected word lines.

Sense amps 2308 can read data from, or write data to the activated memory cells of memory array 2302, which are selected by column control 2306 and row control 2304. Data read out from memory bank 2302 can be provided to an input and input/output buffer 2312. Likewise, data to be written to memory bank 2302 can be received from the input and input/output buffer 2312 and written to the activated memory cells of memory array 2302.

A clock source(s) 2308 can provide respective clock pulses to facilitate timing for read, write, and program operations of row controller 2304 and column controller 2306. Clock source(s) 2308 can further facilitate selection of word lines or bit lines in response to external or internal commands received by operating and control environment 2300. Input and input/output buffer 2312 can comprise a command and address input and a (bidirectional) data input and output according to various embodiments. Instructions are provided over the command and address input, and the data to be written to memory array 2302 as well as data read from memory array 2302 is conveyed on the data input and output, facilitating connection to an external host apparatus, such as a computer or other processing device (not depicted, but see e.g., computer 2402 of FIG. 24, infra).

Input and input/output buffer 2312 can be configured to receive write data, receive an erase instruction, receive a status or maintenance instruction, output readout data, output status information, and receive address data and command data, as well as address data for respective instructions. Address data can be transferred to row controller 2304 and column controller 2306 by an address register 2310. In addition, input data is transmitted to memory bank 2302 via signal input lines between sense amps 2308 and input and input/output buffer 2312, and output data is received from memory array 2302 via signal output lines from sense amps 2308 to input and input/output buffer 2312. Input data can be received from the host apparatus, and output data can be delivered to the host apparatus via the I/O bus.

Commands received from the host apparatus can be provided to a command interface 2316. Command interface 2316 can be configured to receive external control signals from the host apparatus, and determine whether data input to the input and input/output buffer 2312 is write data, a command, or an address. Input commands can be transferred to a state machine 2320.

State machine 2320 can be configured to manage programming and reprogramming of memory array 2302 (as well as other memory banks of the multi-bank memory array). Instructions provided to state machine 2320 are implemented according to control logic configurations, enabling state machine to manage read, write, erase, data input, data output, and other functionality associated with memory array 2302. In some aspects, state machine 2320 can send and receive acknowledgments and negative acknowledgments regarding successful receipt or execution of various commands. In further embodiments, state machine 2320 can decode and implement status-related commands, decode and implement configuration commands, and so on.

To implement read, write, erase, input, output, etc., functionality, state machine 2320 can control clock source(s) 2308 or reference and control signal generator(s) 2318. Control of clock source(s) 2308 can cause output pulses configured to facilitate row controller 2304 and column controller 2306 implementing the particular functionality. Output pulses can be transferred to selected bit lines by column controller 2306, for instance, or word lines by row controller 2304, for instance.

In connection with FIG. 24, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 24:
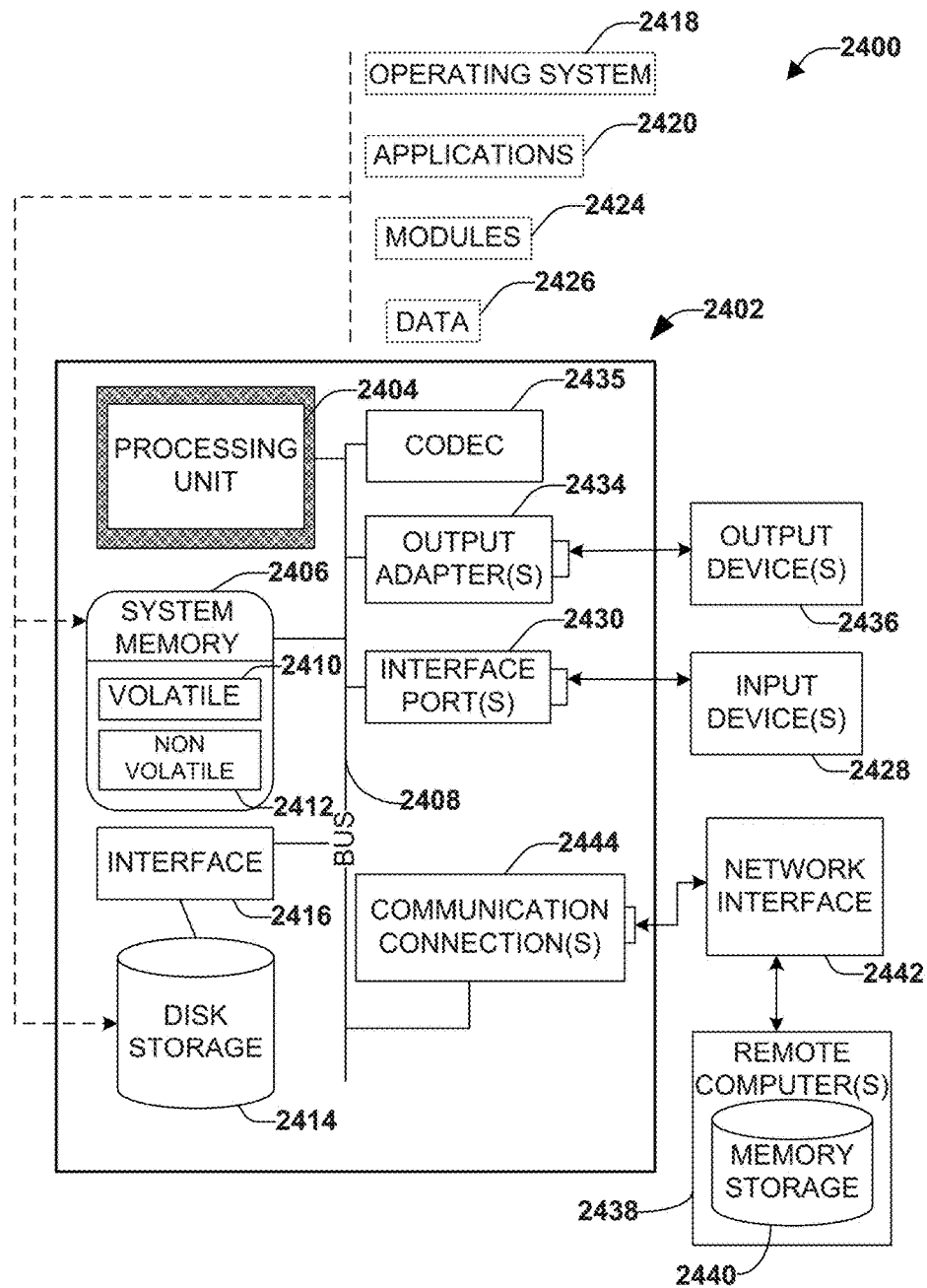
FIG. 24 illustrates a block diagram of an example computing environment that can be implemented in conjunction with various embodiments.

With reference to FIG. 24, a suitable environment 2400 for implementing various aspects of the claimed subject matter includes a computer 2402. The computer 2402 includes a processing unit 2404, a system memory 2406, a codec 2435, and a system bus 2408. The system bus 2408 couples system components including, but not limited to, the system memory 2406 to the processing unit 2404. The processing unit 2404 can be any of various available processors. Dual microprocessors and other multiprocessor architectures also can be employed as the processing unit 2404.

The system bus 2408 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 2406 includes volatile memory 2410 and non-volatile memory 2412, which can employ one or more of the disclosed memory architectures, in various embodiments. The basic input/output system (BIOS), containing the basic routines to transfer information between elements within the computer 2402, such as during start-up, is stored in non-volatile memory 2412. In addition, according to present innovations, codec 2435 may include at least one of an encoder or decoder, wherein the at least one of an encoder or decoder may consist of hardware, software, or a combination of hardware and software. Although, codec 2435 is depicted as a separate component, codec 2435 may be contained within non-volatile memory 2412. By way of illustration, and not limitation, non-volatile memory 2412 can include read only memory (ROM), programmable ROM (PROM), electrically programmable ROM (EPROM), electrically erasable programmable ROM (EEPROM), Flash memory, two-terminal memory, resistive switching memory, or other memory described herein or suitable memory known in the art. Non-volatile memory 2412 can employ one or more of the disclosed memory devices, in at least some embodiments. Moreover, non-volatile memory 2412 can be computer memory (e.g., physically integrated with computer 2402 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 2410 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 2402 may also include removable/non-removable, volatile/non-volatile computer storage medium. FIG. 24 illustrates, for example, disk storage 2414. Disk storage 2414 includes, but is not limited to, devices like a magnetic disk drive, solid state disk (SSD) floppy disk drive, tape drive, Jaz drive, Zip drive, LS-100 drive, flash memory card, or memory stick. In addition, disk storage 2414 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 2414 to the system bus 2408, a removable or non-removable interface is typically used, such as interface 2416. It is appreciated that storage devices 2414 can store information related to a user. Such information might be stored at or provided to a server or to an application running on a user device. In one embodiment, the user can be notified (e.g., by way of output device(s) 2436) of the types of information that are stored to disk storage 2414 or transmitted to the server or application. The user can be provided the opportunity to opt-in or opt-out of having such information collected or shared with the server or application (e.g., by way of input from input device(s) 2428).

It is to be appreciated that FIG. 24 describes software that acts as an intermediary between users and the basic computer resources described in the suitable operating environment 2400. Such software includes an operating system 2418. Operating system 2418, which can be stored on disk storage 2414, acts to control and allocate resources of the computer system 2402. Applications 2420 take advantage of the management of resources by operating system 2418 through program modules 2424, and program data 2426, such as the boot/shutdown transaction table and the like, stored either in system memory 2406 or on disk storage 2414. It is to be appreciated that the claimed subject matter can be implemented with various operating systems or combinations of operating systems.

A user enters commands or information into the computer 2402 through input device(s) 2428. Input devices 2428 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2404 through the system bus 2408 via interface port(s) 2430. Interface port(s) 2430 include, for example, a serial port, a parallel port, a game port, and a universal serial bus (USB). Output device(s) 2436 use some of the same type of ports as input device(s) 2428. Thus, for example, a USB port may be used to provide input to computer 2402 and to output information from computer 2402 to an output device 2436. Output adapter 2434 is provided to illustrate that there are some output devices 2436 like monitors, speakers, and printers, among other output devices 2436, which require special adapters. The output adapters 2434 include, by way of illustration and not limitation, video and sound cards that provide a means of connection between the output device 2436 and the system bus 2408. It should be noted that other devices or systems of devices provide both input and output capabilities such as remote computer(s) 2438.

Computer 2402 can operate in a networked environment using logical connections to one or more remote computers, such as remote computer(s) 2438. The remote computer(s) 2438 can be a personal computer, a server, a router, a network PC, a workstation, a microprocessor based appliance, a peer device, a smart phone, a tablet, or other network node, and typically includes many of the elements described relative to computer 2402. For purposes of brevity, only a memory storage device 2440 is illustrated with remote computer(s) 2438. Remote computer(s) 2438 is logically connected to computer 2402 through a network interface 2442 and then connected via communication connection(s) 2444. Network interface 2442 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 2444 refers to the hardware/software employed to connect the network interface 2442 to the bus 2408. While communication connection 2444 is shown for illustrative clarity inside computer 2402, it can also be external to computer 2402. The hardware/software necessary for connection to the network interface 2442 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A configuration bit for a switching block junction of an electronic device, comprising:
    a switch that controls electrical connection of the switching block junction, the switch having a control input;
    a control circuit that generates a signal output that drives the control input of the switch, the switch being responsive to the signal output and configured to electrically connect the switching block junction in response to a first signal output value and configured to electrically disconnect the switching block junction in response to a second signal output value;
    a memory circuit comprising a two-terminal non-volatile memory device configured to store a data bit and having an input node and an output node; and
    load circuitry configured to provide the data bit to an input node of the control circuit to facilitate updating the signal output of the control circuit with the data bit.

2. The configuration bit of claim 1, wherein the control circuit comprises a static random access memory (SRAM) circuit having a SRAM input selectively connected to or disconnected from the output node of the memory circuit, and having an SRAM output that provides the signal output to the control input of the switch.

3. The configuration bit of claim 1, wherein the control circuit further comprises:

a first input transistor connected electrically in parallel with a second input transistor;
an inverter device having an inverter input and an inverter output; and
a PMOS transistor having a gate that shares a common node with the inverter output, wherein:
the first input transistor and the second input transistor have respective first terminals that share a second common node,
the second common node is connected with the output node of the memory circuit,
the first input transistor and the second input transistor have respective second terminals that share a third common node,
the third common node is connected with the inverter input and a first terminal of the PMOS transistor,
a gate of the second input transistor is connected to the common node with the inverter output and the gate of the PMOS transistor,
a second terminal of the PMOS transistor is connected to a supply voltage, and
the common node provides the signal output that drives the control input of the switch.

4. The configuration bit of claim 3, wherein the load circuitry comprises:
a bitline transistor that selectively connects or disconnects a bitline and a bitline voltage to the second common node shared by the respective first terminals of the first input transistor and the second input transistor; and
a wordline connected to a gate of the bitline transistor to control the selectively connecting or disconnecting of the bitline and bitline voltage with the second common node.

5. The configuration bit of claim 4, wherein the load circuitry further comprises a readset line connected to a gate of the first input transistor configured to activate or deactivate the first input transistor, wherein activation of the first input transistor connects the second common node with the third common node by way of the first input transistor.

6. The configuration bit of claim 5, further comprising:
a sourceline connected to the input node of the memory circuit;
the memory circuit further comprising a bypass transistor connected electrically in parallel with the two-terminal non-volatile memory device, having a first bypass terminal connected to the input node of the memory circuit and a second bypass terminal connected to the second common node; and
a cell disable line connected to a gate of the bypass transistor for activating and deactivating the bypass transistor.

7. The configuration bit of claim 6, wherein preparing the configuration bit for providing the data bit to the input node of the control circuit comprises:
enabling the readset line and activating the first input transistor;
disabling the wordline and deactivating the bitline transistor;
enabling the cell disable line and activating the bypass transistor; and
enabling the source line.

8. The configuration bit of claim 6, wherein setting the data bit stored by the two-terminal non-volatile memory device to a program state further comprises:
disabling the readset line and deactivating the first input transistor;
enabling the wordline and activating the bitline transistor;
disabling the cell disable line and deactivating the bypass transistor;
applying a high voltage to the bitline; and
applying a low voltage to the sourceline.

9. The configuration bit of claim 6, wherein setting the data bit stored by the two-terminal non-volatile memory device to an erase state further comprises:
disabling the readset line and deactivating the first input transistor;
enabling the wordline and activating the bitline transistor;
disabling the cell disable line and deactivating the bypass transistor;
applying a low voltage to the bitline; and
applying a high voltage to the sourceline.

10. The configuration bit of claim 6, wherein reading a value of the data bit stored by the two-terminal non-volatile memory device further comprises:
disabling the readset line and deactivating the first input transistor;
enabling the wordline and activating the bitline transistor;
disabling the cell disable line and deactivating the bypass transistor;
applying a read voltage to the sourceline; and
connecting a sensing circuit to the bitline.

11. The configuration bit of claim 6, wherein providing the data bit to the input node of the control circuit and updating the signal output of the control circuit further comprises:
enabling the readset line and activating the first input transistor;
disabling the wordline and deactivating the bitline transistor;
disabling the cell disable line and deactivating the bypass transistor; and
applying a low voltage to the sourceline.

12. The configuration bit of claim 6, wherein preventing the data bit from being provided to the input node of the control circuit further comprises:
disabling the readset line and deactivating the first input transistor; and
enabling the cell disable line and activating the bypass transistor.

13. The configuration bit of claim 6, further comprising:
a second memory circuit comprising a second two-terminal non-volatile memory device configured to store a second data bit and having an output node connected to the input node of the memory circuit; and
a second cell disable line connected to a gate of a second bypass transistor of the second memory circuit, the second bypass transistor connected electrically in parallel to the second two-terminal non-volatile memory device; wherein
the sourceline is connected directly to an input node of the second memory circuit and indirectly to the input node of the memory circuit.

14. The configuration bit of claim 13, wherein providing the second data bit to the input node of the control circuit to facilitate updating the signal output of the control circuit with the second data bit comprises:
enabling the readset line and activating the first input transistor;
disabling the wordline and deactivating the bitline transistor;
enabling the cell disable line and activating the bypass transistor;

deactivating the second cell disable line and deactivating the second bypass transistor; and providing a low voltage on the sourceline.

15. The configuration bit of claim 13, wherein setting the second data bit stored by the second two-terminal non-volatile memory device to a program state further comprises:

disabling the readset line and deactivating the first input transistor;

enabling the wordline and activating the bitline transistor;

enabling the cell disable line and activating the bypass transistor;

disabling the second cell disable line and deactivating the second bypass transistor;

applying a high voltage to the bitline; and applying a low voltage to the sourceline.

16. The configuration bit of claim 13, wherein setting the second data bit stored by the second two-terminal non-volatile memory device to an erase state further comprises:

disabling the readset line and deactivating the first input transistor;

enabling the wordline and activating the bitline transistor;

enabling the cell disable line and activating the bypass transistor;

disabling the second cell disable line and deactivating the second bypass transistor;

applying a low voltage to the bitline; and applying a high voltage to the sourceline.

17. The configuration bit of claim 13, wherein reading a value of the data bit stored by the two-terminal non-volatile memory device further comprises:

disabling the readset line and deactivating the first input transistor;

enabling the wordline and activating the bitline transistor;

enabling the cell disable line and activating the bypass transistor;

disabling the second cell disable line and deactivating the second bypass transistor;

applying a read voltage to the sourceline; and connecting a sensing circuit to the bitline.

18. The configuration bit of claim 1, wherein the load circuitry further comprises a bypass circuit configured to prevent the data bit stored by the memory circuit from updating the signal output of the control circuit.

19. The configuration bit of claim 18, wherein the bypass circuit comprises a transistor connected in parallel to the two-terminal non-volatile memory device.

20. The configuration bit of claim 19, wherein the transistor has a transistor low resistance state with greater electrical conductivity than a corresponding memory low resistance state of the two-terminal non-volatile memory device.

* * * * *